(12) United States Patent
Fujimura et al.

(10) Patent No.: US 9,453,145 B2
(45) Date of Patent: Sep. 27, 2016

(54) INSULATING ADHESIVE FILM, PREPREG, LAMINATE, CURED ARTICLE, AND COMPOSITE ARTICLE

(71) Applicant: ZEON CORPORATION, Tokyo (JP)

(72) Inventors: Makoto Fujimura, Tokyo (JP); Masafumi Kawasaki, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 390 days.

(21) Appl. No.: 14/348,324

(22) PCT Filed: Sep. 28, 2012

(86) PCT No.: PCT/JP2012/075033
§ 371 (c)(1),
(2) Date: Mar. 28, 2014

(87) PCT Pub. No.: WO2013/047726
PCT Pub. Date: Apr. 4, 2013

(65) Prior Publication Data
US 2014/0234614 A1    Aug. 21, 2014

(30) Foreign Application Priority Data
Sep. 30, 2011 (JP) ................. 2011-216823

(51) Int. Cl.
| | | |
|---|---|---|
| *B32B 7/12* | (2006.01) | |
| *C09J 123/18* | (2006.01) | |
| *C09J 7/02* | (2006.01) | |
| *C09J 11/04* | (2006.01) | |
| *H05K 3/38* | (2006.01) | |
| *B32B 27/32* | (2006.01) | |
| *H05K 1/03* | (2006.01) | |

(52) U.S. Cl.
CPC ............... *C09J 7/0271* (2013.01); *B32B 7/12* (2013.01); *B32B 27/325* (2013.01); *C09J 7/0203* (2013.01); *C09J 11/04* (2013.01); *C09J 123/18* (2013.01); *H05K 3/387* (2013.01); *B32B 2305/076* (2013.01); *H05K 1/0366* (2013.01); *H05K 2201/0209* (2013.01); *Y10T 428/259* (2015.01); *Y10T 428/2878* (2015.01); *Y10T 428/31938* (2015.04)

(58) Field of Classification Search
None
See application file for complete search history.

(56) References Cited

U.S. PATENT DOCUMENTS

| | | | |
|---|---|---|---|
| 2004/0025743 A1 | 2/2004 | Wakizaka et al. | |
| 2007/0060674 A1 | 3/2007 | Wakizaka et al. | |
| 2009/0283308 A1* | 11/2009 | Tsukamoto | C08G 59/306 174/258 |

FOREIGN PATENT DOCUMENTS

| | | |
|---|---|---|
| JP | 2001-244640 A | 9/2001 |
| JP | 2002-84073 A | 3/2002 |
| JP | 2006307155 A | 11/2006 |
| JP | 2008-153580 A | 7/2008 |
| JP | 2008-182146 A | 8/2008 |
| JP | 2008-265069 A | 11/2008 |
| TW | 521548 B | 2/2003 |
| TW | 2007030555 | 1/2006 |
| WO | 2004/086833 A1 | 10/2004 |
| WO | 2008/114674 A1 | 9/2008 |
| WO | 2009/038177 A1 | 3/2009 |

OTHER PUBLICATIONS

International Search Report dated Dec. 25, 2012 issued in corresponding application No. PCT/JP2012/075033.

* cited by examiner

*Primary Examiner* — Sheeba Ahmed
(74) *Attorney, Agent, or Firm* — Westerman, Hattori, Daniels & Adrian, LLP

(57) ABSTRACT

An insulating adhesive by having a plateable layer which is comprised of a plateable layer-use resin composition which contains a polar group-containing alicyclic olefin polymer (A1) and a curing agent (A2) and an adhesive layer which is comprised of an adhesive layer-use resin composition which contains a polar group-containing alicyclic olefin polymer (B1), a curing agent (B2), and an inorganic filler (B3), wherein a ratio of content of the polar group-containing alicyclic olefin polymer (A1) to the solid content as a whole which is contained in the plateable layer is 50 to 90 wt %, and a ratio of content of the polar group-containing alicyclic olefin polymer (B1) to the solid content as a whole which is contained in the adhesive layer is 1 to 30 wt % and a ratio of content of the inorganic filler (B3) is 50 to 90 wt % is provided.

20 Claims, No Drawings

(12) United States Patent US 9,453,145 B2

INSULATING ADHESIVE FILM, PREPREG, LAMINATE, CURED ARTICLE, AND COMPOSITE ARTICLE

TECHNICAL FIELD

The present invention relates to an insulating adhesive film, prepreg, laminate, cured article, and composite article.

BACKGROUND ART

Along with the pursuit of smaller sizes, increased functions, and faster communications in electronic equipment, further higher densities of the circuit boards which are used for the electronic equipment have been sought. To meet such demands for higher densities, circuit boards are being made multilayered. Such multilayer circuit boards are, for example, formed by taking an inside layer board which is comprised of an electrical insulating layer and a conductor layer which is formed on its surface, laminating an electrical insulating layer over it, forming a conductor layer over this electrical insulating layer, and further repeating this lamination of an electrical insulating layer and formation of a conductor layer. The electrical insulating layer and the conductor layer can be formed in several stages as required.

In such a multilayer circuit board, the difference in linear expansion between the conductor layers and the electrical insulating layers sometimes causes the circuit to break. In particular, this problem of breakage of circuit was remarkable when the conductor layers formed high density patterns. Therefore, in multilayer circuit boards, reduction of the linear expansion of the electrical insulating layers has been sought. To lower the linear expansion of electrical insulating layers, in general, adding an inorganic filler is effective, but by adding an inorganic filler, the electrical insulating layers end up becoming greater in surface roughness. When forming conductor layers on the surfaces of the electrical insulating layers and etching the conductor layers so as to form micro wiring, there is the problem that poor etching leads to the conductor remaining between the patterns and to blistering or peeling of the conductors.

As opposed to this, to reduce the surface roughness of electrical insulating layers, for example, Patent Document 1 discloses the art of forming the electrical insulating layers by two-layer structures of layer which contains an inorganic filler and layer which does not contain an inorganic filler.

Further, Patent Document 2 discloses the art of forming the electrical insulating layers by two-layer structures of layer which contains a polyimide, polyamide, or other resin ingredients and inorganic fillers with a specific surface area of 20 m$^2$/g or more and 600 m$^2$/g or less and layer which contains resin ingredients such as thermoplastic polyimide and inorganic fillers with an average particle diameter from 0.1 to 5 µm.

PRIOR ART DOCUMENTS

Patent Documents

Patent Document 1: WO2004/086833A
Patent Document 2: Japanese Patent Publication No. 2008-265069A

SUMMARY OF THE INVENTION

Problem to be Solved by the Invention

However, the inventors studied this and found that with the art which is described in the above-mentioned Patent Document 1, the obtained electrical insulating layers end up larger in linear expansion coefficients and larger in difference of linear expansion with the conductor layers resulting in liable to break in the circuits.

Further, with the art which is described in Patent Document 2, when forming the via holes, there was the problem of roughening of the opening edges of the via holes, the problem of poor dispersability of filler in the electrical insulating layers and therefore the surface roughnesses ending up becoming larger, etc.

The object of the present invention is to provide an insulating adhesive film which can form an electrical insulating layer which is low in surface roughness, low in linear expansion, excellent in via hole formability, and high in peel strength, and a prepreg, laminate, cured article, and composite article which are obtained using the same.

Means for Solving the Problems

The inventors engaged in intensive research to achieve the above object and as a result discovered that by forming the insulating adhesive film by a two-layer structure which is comprised of a plateable layer which contains 50 to 90 wt % of a polar group-containing alicyclic type olefin polymer and a curing agent and an adhesive layer which contains 1 to 30 wt % of a polar group-containing alicyclic type olefin polymer, a curing agent, and 50 to 90 wt % of an inorganic filler, that the insulating adhesive film can be used to form an electrical insulating layer which is low in surface roughness, low in linear expansion, excellent in via hole formability, and high in peel strength, and thereby completed the present invention.

That is, according to the present invention,

[1] an insulating adhesive film having a plateable layer which is comprised of a plateable layer-use resin composition which contains a polar group-containing alicyclic olefin polymer (A1) and a curing agent (A2) and an adhesive layer which is comprised of an adhesive layer-use resin composition which contains a polar group-containing alicyclic olefin polymer (B1), a curing agent (B2), and an inorganic filler (B3), wherein a ratio of content of the polar group-containing alicyclic olefin polymer (A1) to the solid content as a whole which is contained in the plateable layer is 50 to 90 wt %, and a ratio of content of the polar group-containing alicyclic olefin polymer (B1) to the solid content as a whole which is contained in the adhesive layer is 1 to 30 wt % and a ratio of content of the inorganic filler (B3) is 50 to 90 wt %,

[2] an insulating adhesive film having a plateable layer which is comprised of a plateable layer-use resin composition which contains a polar group-containing alicyclic olefin polymer (A1) and a curing agent (A2) and an adhesive layer which is comprised of an adhesive layer-use resin composition which contains a polar group-containing alicyclic olefin polymer (B1), a curing agent (B2), and an inorganic filler (B3), wherein a ratio of content of the polar group-containing alicyclic olefin polymer (A1) to the solid content as a whole which is contained in the plateable layer is 50 to 90 wt %, and a ratio of content of the polar group-containing alicyclic olefin polymer (B1) to the solid content as a whole with the exception of the inorganic filler (B3) which is contained in the adhesive layer is 20 wt % or less and a ratio of content of the inorganic filler (B3) to the solid content as a whole which is contained in the adhesive layer is 50 to 90 wt %,

[3] the insulating adhesive film as set forth in [1] or [2], wherein the plateable layer-use resin composition which forms the plateable layer further contains an inorganic filler (A3), and a ratio of content of the inorganic filler (A3) to the solid content as a whole which is contained in the plateable layer is 1 to 40 wt %,

[4] the insulating adhesive film as set forth in any one of [1] to [3], wherein the inorganic filler (B3) is spherical silica having an average particle diameter from 0.2 to 3 μm,

[5] the insulating adhesive film as set forth in any one of [1] to [4], wherein the inorganic filler (B3) is surface treated spherical silica which is treated on its surface,

[6] the insulating adhesive film as set forth in any one of [3] to [5], wherein the inorganic filler (A3) is spherical silica having an average particle diameter from 0.1 to 0.5 μm,

[7] the insulating adhesive film as set forth in any one of [3] to [6], wherein the inorganic filler (A3) is untreated spherical silica which is not treated on its surface,

[8] a prepreg which is comprised of the insulating adhesive film as set forth in any one of [1] to [7] and a fiber base material,

[9] a laminate obtained by laminating the insulating adhesive film as set forth in any one of [1] to [7] or the prepreg as set forth in [8] on a base material,

[10] a cured article obtained by curing the insulating adhesive film as set forth in any one of [1] to [7], the prepreg as set forth in [8], or the laminate as set forth in [9],

[11] a composite article obtained by forming a conductive layer on the surface of the cured article as set forth in [10] by electroless plating, and

[12] a substrate for electronic material-use which is comprised of the cured article as set forth in [10] or the composite article as set forth in [11] as a component material are provided.

EFFECTS OF THE INVENTION

According to the present invention, there are provided an insulating adhesive film which can form an electrical insulating layer which is low in surface roughness, low in linear expansion, excellent in via hole formability, and high in peel strength, and a prepreg, laminate, cured article, and composite article which are obtained using the same.

DESCRIPTION OF EMBODIMENTS

The insulating adhesive film of the present invention has a plateable layer which is comprised of a plateable layer-use resin composition which contains a polar group-containing alicyclic olefin polymer (A1) and a curing agent (A2) and an adhesive layer which is comprised of an adhesive layer-use resin composition which contains a polar group-containing alicyclic olefin polymer (B1), a curing agent (B2), and an inorganic filler (B3), wherein a ratio of content of the polar group-containing alicyclic olefin polymer (A1) to the solid content as a whole which is contained in the plateable layer is 50 to 90 wt %, and a ratio of content of the polar group-containing alicyclic olefin polymer (B1) to the solid content as a whole which is contained in the adhesive layer is 1 to 30 wt % and a ratio of content of the inorganic filler (B3) is 50 to 90 wt %.

Note that, in this Description, "alicyclic olefin polymer" means a polymer which contains monomer units of olefins which have alicyclic structures (alicyclic olefins) or monomer units which can be regarded as the same as those monomer units (below, for convenience, the two being referred to all together as "alicyclic olefin monomer units").

(Plateable Layer-Use Resin Composition)

First, the plateable layer-use resin composition for forming the plateable layer will be explained. The plateable layer-use resin composition used in the present invention contains a polar group-containing alicyclic olefin polymer (A1) and a curing agent (A2).

(Polar Group-Containing Alicyclic Olefin Polymer (A1))

The plateable layer-use resin composition used in the present invention contains a polar group-containing alicyclic olefin polymer (A1) as a resin ingredient. As the alicyclic structure which forms the polar group-containing alicyclic olefin polymer (A1) (below, suitably abbreviated as "alicyclic olefin polymer (A1)") used in the present invention, a cycloalkane structure, cycloalkene structure, etc. may be mentioned, but from the viewpoint of the mechanical strength, the heat resistance, etc., a cycloalkane structure is preferable. Further, as the alicyclic structure, a monocyclic, polycyclic, condensed polycyclic, or bridged ring structure or polycyclic structure comprised of a combination of these etc. may be mentioned. The number of carbon atoms which form the alicyclic structure is not particularly limited, but is usually 4 to 30, preferably 5 to 20, more preferably 5 to 15 in range. If the number of carbon atoms which form the cyclic structure is in this range, the various properties of the mechanical strength, heat resistance, and shapeability are well balanced, so this is preferred. Further, the alicyclic olefin polymer (A1) is usually thermoplastic.

The alicyclic structure of the alicyclic olefin polymer (A1) is comprised of the monomer units of olefins which have an alicyclic structure which are formed by carbon atoms, that is, alicyclic olefin monomer units. The alicyclic olefin polymer (A1) may include not only alicyclic olefin monomer units, but also other monomer units. The ratio of the alicyclic olefin monomer units in the alicyclic olefin polymer (A1) is not particularly limited, but is usually 30 to 100 wt %, preferably 50 to 100 wt %, more preferably 70 to 100 wt %. If the ratio of the alicyclic olefin monomer units is too small, the polymer is inferior in heat resistance, so this is not preferred. The monomer units other than the alicyclic olefin monomer units are not particularly limited and are suitably selected in accordance with the objective.

The polar groups of the alicyclic olefin polymer (A1) are not particularly limited, but alcoholic hydroxyl groups, phenolic hydroxyl groups, carboxyl groups, alkoxyl groups, epoxy groups, glycidyl groups, oxycarbonyl groups, carbonyl groups, amino groups, ester groups, carboxylic anhydride groups, sulfonic acid groups, phosphoric acid groups, etc. may be mentioned. Among these, carboxyl groups, carboxylic anhydride groups, and phenolic hydroxyl groups are preferable and carboxylic anhydride groups are more preferable. Note that, the alicyclic olefin polymer (A1) may have two or more types of polar groups. Further, the polar groups of the alicyclic olefin polymer (A1) may be directly bonded with the atoms which form the mainchain of the polymer or may be bonded through other bivalent groups such as methylene group, oxy group, oxycarbonyl oxyalkylene groups, phenylene groups, etc. The content of the monomer units which have polar groups in the alicyclic olefin polymer (A1) is not particularly limited, but is normally 4 to 60 mol % with respect to 100 mol % of the total monomer units which form the alicyclic olefin polymer (A1), preferably 8 to 50 mol %.

The alicyclic olefin polymer (A1) used in the present invention, for example, may be obtained by the following methods. That is, it may be obtained by (1) the method of polymerizing alicyclic olefins which have polar groups with the addition of other monomers as required, (2) the method of copolymerizing alicyclic type olefins which do not have polar groups with monomers which have polar groups, (3) the method of polymerizing aromatic olefins which have polar groups with the addition of other monomers as required and hydrogenating the aromatic ring parts of the polymer which is obtained from the same, (4) the method of copolymerizing aromatic olefins which do not have polar groups with monomers which have polar groups and hydrogenating the aromatic ring parts of the polymer which is obtained from the same, (5) the method of introducing compounds which have polar groups in alicyclic olefin polymers which do not have polar group by modification reactions, (6) the method of for example hydrolyzing the polar groups of alicyclic type olefin polymers which have polar groups (for example, carboxylic acid ester groups etc.) which are obtained by the above (1) to (5) to convert them to other polar groups (for example, carboxyl groups), etc. Among these, polymers which are obtained by the method of (1) are preferable.

For the polymerization method for obtaining the alicyclic olefin polymer (A1) used in the present invention, ring opening polymerization or addition polymerization is used, but in the case of ring opening polymerization, it is preferable to hydrogenate the obtained ring-opening polymer.

As specific examples of the alicyclic olefins which have polar groups, 5-hydroxycarbonylbicyclo[2.2.1]hept-2-ene, 5-methyl-5-hydroxycarbonylbicyclo[2.2.1]hept-2-ene, 5-carboxymethyl-5-hydroxycarbonylbicyclo[2.2.1]hept-2-ene, 9-hydroxycarbonyltetracyclo[6.2.1.1$^{3,6}$.0$^{2,7}$]dodec-4-ene, 9-methyl-9-hydroxycarbonyltetracyclo[6.2.1.1$^{3,6}$.0$^{2,7}$]dodec-4-ene, 9-carboxymethyl-9-hydroxycarbonyltetracyclo[6.2.1.1$^{3,6}$.0$^{2,7}$]dodec-4-ene, 5-exo-6-endo-dihydroxycarbonylbicyclo[2.2.1]hept-2-ene, 9-exo-10-endo-dihydroxycarbonyltetracyclo[6.2.1.1$^{3,6}$.0$^{2,7}$]dodec-4-ene, and other alicyclic olefins which have carboxyl groups; bicyclo[2.2.1]hept-2-ene-5,6-dicarboxylic anhydride, tetracyclo[6.2.1.1$^{3,6}$.0$^{2,7}$]dodec-4-ene-9,10-dicarboxylic anhydride, hexacyclo[10.2.1.1$^{3,10}$.1$^{5,8}$.0$^{2,11}$.0$^{4,9}$]heptadec-6-ene-13,14-dicarboxylic anhydride, and other alicyclic olefins which have carboxylic anhydride groups; 9-methyl-9-methoxycarbonyltetracyclo[6.2.1.1$^{3,6}$.0$^{2,7}$]dodec-4-ene, 5-methoxycarbonyl-bicyclo[2.2.1]hept-2-ene, 5-methyl-5-methoxycarbonyl-bicyclo[2.2.1]hept-2-ene, and other alicyclic type olefins which have carboxylic acid ester groups; (5-(4-hydroxyphenyl)bicyclo[2.2.1]hept-2-ene, 9-(4-hydroxyphenyl)tetracyclo[6.2.1.1$^{3,6}$.0$^{2,7}$]dodec-4-ene, N-(4-hydroxyphenyl)bicyclo[2.2.1]hept-5-ene-2,3-dicarboxyimide, and other alicyclic olefins which have phenolic hydroxyl groups etc. may be mentioned. These may be used alone or may be used in two or more types.

As specific examples of alicyclic olefins which do not have polar groups, bicyclo[2.2.1]hept-2-ene (common name: norbornene), 5-ethyl-bicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[5.2.1.0$^{2,6}$]deca-3,8-diene (common name: dicyclopentadiene), tetracyclo[6.2.1.1$^{3,6}$.0$^{2,7}$]dodec-4-ene (common name: tetracyclododecene), 9-methyl-tetracyclo[6.2.1.1$^{3,6}$.0$^{2,7}$]dodec-4-ene, 9-ethyl-tetracyclo[6.2.1.1$^{3,6}$.0$^{2,7}$]dodec-4-ene, 9-methylidenete-tracyclo[6.2.1.1$^{3,6}$.0$^{2,7}$]dodec-4-ene, 9-ethylidene-tetracyclo[6.2.1.1$^{3,6}$.0$^{2,7}$]dodec-4-ene, 9-methoxycarbonyl-tetracyclo[6.2.1.1$^{3,6}$.0$^{2,7}$]dodec-4-ene, 9-vinyltetracyclo[6.2.1.1$^{3,6}$.0$^{2,7}$]dodec-4-ene, 9-propenyl-tetracyclo[6.2.1.1$^{3,6}$.0$^{2,7}$]dodec-4-ene, 9-phenyl-tetracyclo[6.2.1.1$^{3,6}$.0$^{2,7}$]dodec-4-ene, tetracyclo[9.2.1.0$^{2,10}$.0$^{3,8}$]tetradeca-3,5,7,12-tetraene, cyclopentene, cyclopentadiene, etc. may be mentioned. These may be used alone or may be used in two or more types.

As examples of aromatic olefins which do not have polar groups, styrene, α-methylstyrene, divinylbenzene, etc. may be mentioned. When these specific examples have the polar groups, they may be mentioned as examples of aromatic olefins which have polar groups. These may be used alone or may be used in two or more types.

As monomers which have polar groups which can be copolymerized with alicyclic olefins or aromatic olefins and are other than alicyclic olefins which have polar groups, ethylenically unsaturated compounds which have polar groups may be mentioned. As specific examples of these, acrylic acid, methacrylic acid, α-ethylacrylic acid, 2-hydroxyethyl (meth)acrylic acid, maleic acid, fumaric acid, itaconic acid, and other unsaturated carboxylic acid compounds; maleic anhydride, butenylsuccinic anhydride, tetrahydrophthalic anhydride, citraconic anhydride, and other unsaturated carboxylic anhydrides; etc. may be mentioned. These may be used alone or may be used in two or more types.

As monomers which do not have polar groups which can be copolymerized with alicyclic olefins or aromatic olefins and are other than alicyclic olefins, ethylenically unsaturated compounds which do not have polar groups may be mentioned. As specific examples of these, ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and other $C_2$ to $C_{20}$ ethylenes or α-olefins; 1,4-hexadiene, 4-methyl-1,4-hexadiene, 5-methyl-1,4-hexadiene, 1,7-octadiene, and other unconjugated dienes; etc. may be mentioned. These may be used alone or may be used in two or more types.

The alicyclic olefin polymer (A1) used in the present invention is not particularly limited in molecular weight, but preferably has a weight average molecular weight converted to polystyrene, measured by gel permeation chromatography using tetrahydrofuran as a solvent, of 500 to 1,000,000 in range, more preferably 1,000 to 500,000 in range, particularly preferably 3,000 to 300,000 in range. If the weight average molecular weight is too small, the cured article obtained by curing the resin composition falls in mechanical strength, while if too large, the workability tends to deteriorate when formed into a sheet shape or film shape to obtain a shaped article.

As the polymerization catalyst in the case of obtaining the alicyclic olefin polymer (A1) used in the present invention by ring opening polymerization, a conventionally known metathesis polymerization catalyst can be used. As the metathesis polymerization catalyst, a transition metal compound which contains atoms of Mo, W, Nb, Ta, Ru, etc. may be illustrated. Among these, compounds which contain Mo, W, or Ru are high in polymerization activity and therefore preferred. As specific examples of particularly preferable metathesis polymerization catalysts, (1) catalysts which include, as main catalysts, molybdenum or tungsten compounds which has halogen groups, imide groups, alkoxyl groups, allyloxy groups, or carbonyl groups as ligands and include organometallic compounds as second ingredients and (2) metal carbene complex catalysts which have Ru as the central metal may be mentioned.

As examples of compounds which are used as the main catalysts in the catalysts of the above (1), $MoCl_5$, $MoBr_5$, and other halogenated molybdenum compounds and $WCl_6$, $WOCl_4$, tungsten(phenylimide)tetrachloride diethyl ether and other halogenated tungsten compounds may be mentioned. Further, as the organometallic compounds which are used as the second ingredients in the catalyst of the above (1), organometallic compounds of Group I, Group II, Group XII, Group XIII, or Group XIV of the Periodic Table may be mentioned. Among these, organolithium compounds, organomagnesium compounds, organozinc compounds, organoaluminum compounds, and organotin compounds are preferable, while organolithium compounds, organoaluminum compounds, and organotin compounds are particularly preferable. As organolithium compounds, n-butyllithium, methyllithium, phenyllithium, neopentyllithium, neophyllithium, etc. may be mentioned. As organomagnesium compounds, butylethylmagnesium, butyloctylmagnesium, dihexylmagnesium, ethylmagnesium chloride, n-butylmagnesium chloride, allylmagnesium bromide, neopentylmagnesium chloride, neophylmagnesium chloride, etc. may be mentioned. As organozinc compounds, dimethylzinc, diethylzinc, diphenylzinc, etc. may be mentioned. As organoaluminum compounds, trimethylaluminum, triethylaluminum, triisobutylaluminum, diethylaluminum chloride, ethylaluminum sesquichloride, ethylaluminum dichloride, diethylaluminum ethoxide, ethylaluminum diethoxide, etc. may be mentioned. Furthermore, it is possible to use aluminoxane compounds which are obtained by reaction of these organoaluminum compounds and water. As organotin compounds, tetramethyltin, tetra(n-butyl)tin, tetraphenyltin, etc. may be mentioned. The amounts of these organometallic compounds differ depending on the organometallic compounds used, but by molar ratio with respect to the central metal of the main catalyst, 0.1 to 10,000 times is preferable, 0.2 to 5,000 times is more preferable, and 0.5 to 2,000 times is particularly preferable.

Further, as the metal carbene complex catalyst having Ru as a central metal in the above (2), (1,3-dimesitylimidazolidin-2-ylidene) (tricyclohexylphosphine)benzylideneruthenium dichloride, bis(tricyclohexylphosphine)benzylideneruthenium dichloride, tricyclohexylphosphine-[1,3-bis(2,4,6-trimethylphenyl)-4,5-dibromoimidazol-2-ylidene]-[benzylidene]ruthenium dichloride, 4-acetoxybenzylidene (dichloro)(4,5-dibromo-1,3-dimesityl-4-imidazolin-2-ylidene)(tricyclohexylphosphine)ruthenium, etc. may be mentioned.

The ratio of use of the metathesis polymerization catalyst is, by molar ratio with respect to the monomers which are used for the polymerization (transition metal in metathesis polymerization catalyst:monomers), usually 1:100 to 1:2,000,000 in range, preferably 1:200 to 1:1,000,000 in range. If the amount of the catalyst is too great, the removal of the catalyst becomes difficult, while if too small, a sufficient polymerization activity is liable to be unable to be obtained.

The polymerization reaction is usually performed in an organic solvent. The organic solvent which is used is not particularly limited so long as the polymer dissolves or disperses under predetermined conditions and the solvent does not affect the polymerization, but one which is generally used industrially is preferable. As specific examples of the organic solvent, pentane, hexane, heptane, and other aliphatic hydrocarbons; cyclopentane, cyclohexane, methyl cyclohexane, dimethylcyclohexane, trimethylcyclohexane, ethylcyclohexane, diethylcyclohexane, decahydronaphthalene, bicycloheptane, tricyclodecane, hexahydroindene, cyclooctane, and other alicyclic hydrocarbons; benzene, toluene, xylene, and other aromatic hydrocarbons; dichloromethane, chloroform, 1,2-dichloroethane, and other halogen-containing aliphatic hydrocarbons; chlorobenzene, dichlorobenzene, and other halogen-containing aromatic hydrocarbons; nitromethane, nitrobenzene, acetonitrile, and other nitrogen-containing hydrocarbons; diethyl ether, tetrahydrofuran, and other ethers; anisole, phenetol, and other aromatic ethers; etc. may be mentioned. Among these as well, the industrially generally used aromatic hydrocarbons and aliphatic hydrocarbons, alicyclic hydrocarbons, ethers, and aromatic ethers are preferable.

The use amount of the organic solvent is preferably an amount which gives a concentration of the monomers in the polymerization solution of 1 to 50 wt %, more preferably 2 to 45 wt %, particularly preferably 3 to 40 wt %. If the concentration of the monomers is less than 1 wt %, the productivity becomes poor, while if over 50 wt %, the solution after polymerization becomes too high in viscosity and the subsequent hydrogenation reaction sometimes becomes difficult.

The polymerization reaction is started by mixing the monomers which are used for the polymerization and the metathesis polymerization catalyst. As the method for mixing these, the metathesis polymerization catalyst solution may be added to the monomer solution or vice versa. When the metathesis polymerization catalyst which is used is a mixed catalyst of a main catalyst constituted by a transition metal compound and a second ingredient constituted by an organometallic compound, the reaction solution of the mixed catalyst may be added to the monomer solution or vice versa. Further, a solution of the transition metal compound may be added to a mixed solution of the monomers and organometallic compound or vice versa. Furthermore, an organometallic compound may be added to a mixed solution of the monomers and a transition metal compound or vice versa.

The polymerization temperature is not particularly limited, but is usually −30° C. to 200° C., preferably 0° C. to 180° C. The polymerization time is not particularly limited, but is usually 1 minute to 100 hours.

As the method of adjusting the molecular weight of the obtained alicyclic olefin polymer (A1), the method of adding a suitable amount of a vinyl compound or diene compound may be mentioned. The vinyl compound which is used for adjustment of the molecular weight is not particularly limited so long as an organic compound which has vinyl groups, but 1-butene, 1-pentene, 1-hexene, 1-octene, and other α-olefins; styrene, vinyl toluene, and other styrenes; ethylvinyl ether, i-butylvinyl ether, allylglycidyl ether, and other ethers; allylchloride and other halogen-containing vinyl compounds; allyl acetate, allyl alcohol, glycidyl methacrylate, and other oxygen-containing vinyl compounds, acrylamide and other nitrogen-containing vinyl compounds, etc. may be mentioned. As the diene compounds which are used for adjustment of the molecular weight, 1,4-pentadiene, 1,4-hexadiene, 1,5-hexadiene, 1,6-heptadiene, 2-methyl-1,4-pentadiene, 2,5-dimethyl-1,5-hexadiene, and other unconjugated dienes or 1,3-butadiene, 2-methyl-1,3-butadiene, 2,3-dimethyl-1,3-butadiene, 1,3-pentadiene, 1,3-hexadiene, and other conjugated dienes may be mentioned. The amount of addition of the vinyl compound or diene compound may be freely selected, in accordance with the molecular weight which is targeted, from 0.1 to 10 mol %.

As the polymerization catalyst when obtaining the alicyclic olefin polymer (A1) used in the present invention by addition polymerization, for example, a catalyst which is comprised of a titanium, zirconium, or vanadium compound and an organoaluminum compound may be suitably used. These polymerization catalysts can be used alone or as two or more types combined. The amount of the polymerization catalyst is, by molar ratio of the metal compound in the polymerization catalyst:monomers which are used for the polymerization, usually 1:100 to 1:2,000,000 in range.

When using a hydrogenated product of a ring-opening polymer as the alicyclic olefin polymer (A1) used in the present invention, the hydrogenation of the ring-opening polymer is usually performed by using a hydrogenation catalyst. The hydrogenation catalyst is not particularly limited, but one which is generally used at the time of hydrogenation of an olefin compound may be suitably employed. As specific examples of a hydrogenation catalyst, for example, a Ziegler catalyst which is comprised of a combination of a transition metal compound and an alkali metal compound such as cobalt acetate and triethylaluminum, nickel acetyl acetonate and triisobutylaluminum, titanocene dichloride and n-butyllithium, zirconocene dichloride and sec-butyllithium, and tetrabutoxytitanate and dimethylmagnesium; dichlorotris(triphenylphosphine)rhodium, the ones which are described in Japanese Patent Publication No. 7-2929A, Japanese Patent Publication No. 7-149823A, Japanese Patent Publication No. 11-209460A, Japanese Patent Publication No. 11-158256A, Japanese Patent Publication No. 11-193323A, Japanese Patent Publication No. 11-209460A, etc., precious metal complex catalysts comprised of bis(tricyclohexylphosphine)benzylidyneruthenium (IV)dichloride and other ruthenium compounds; and other homogeneous catalysts may be mentioned. Further, heterogeneous catalysts of nickel, palladium, platinum, rhodium, ruthenium, and other metals carried on a carbon, silica, diatomaceous earth, alumina, titanium oxide, and other carrier, for example, nickel/silica, nickel/diatomaceous earth, nickel/alumina, palladium/carbon, palladium/silica, palladium/diatomaceous earth, palladium/alumina, etc., may also be used. Further, the above-mentioned metathesis polymerization catalysts may also be used as they are as hydrogenation catalysts.

The hydrogenation reaction is usually performed in an organic solvent. The organic solvent may be suitably selected in accordance with the solubility of the hydrogenated product which is produced. An organic solvent similar to the organic solvent which is used in the above-mentioned polymerization reaction may be used. Therefore, after the polymerization reaction, there is no need to replace the organic solvent. It is possible to add a hydrogenation catalyst for a reaction as is. Furthermore, among the organic solvents which are used for the above-mentioned polymerization reaction, from the viewpoint of their not reacting at the time of the hydrogenation reaction, an aromatic hydrocarbons, aliphatic hydrocarbons, alicyclic hydrocarbons, ethers, or aromatic ethers is preferable, while an aromatic ether is more preferable.

The hydrogenation reaction conditions may be suitably selected in accordance with the type of the hydrogenation catalyst which is used. The reaction temperature is usually −20 to 250° C., preferably −10 to 220° C., more preferably 0 to 200° C. If lower than −20° C., the reaction velocity becomes slow, while conversely if higher than 250° C., secondary reactions easily occur. The pressure of the hydrogen is usually 0.01 to 10.0 MPa, preferably 0.05 to 8.0 MPa. If the hydrogen pressure is lower than 0.01 MPa, the hydrogenation reaction velocity becomes slow, while if higher than 10.0 MPa, a high pressure resistant reaction apparatus becomes necessary.

The time of the hydrogenation reaction is suitably selected for controlling the hydrogenation rate. The reaction time is usually 0.1 to 50 hours in range. It is possible to hydrogenate 50 mol % or more of the 100 mol % of carbon-carbon double bonds of the mainchain in the polymer, preferably 70 mol % or more, more preferably 80 mol % or more, particularly preferably 90 mol % or more.

After performing the hydrogenation reaction, it is possible to perform processing to remove the catalyst which is used for the hydrogenation reaction. The method of removal of the catalyst is not particularly limited. Centrifugation, filtration, or other methods may be mentioned. Furthermore, it is possible to add water, alcohol, or another catalyst deactivator or add active clay, alumina, diatomaceous earth, or another adsorbent so as to promote removal of the catalyst.

The alicyclic olefin polymer (A1) used in the present invention may be used as the polymer solution after polymerization or the hydrogenation reaction or may be used after removal of the solvent, but since dissolution or dispersion of the additives becomes better when preparing the resin composition and since the process can be simplified, use as a polymer solution is preferable.

The amount of the alicyclic olefin polymer (A1) in the plateable layer-use resin composition used in the present invention is preferably made a range whereby the ratio of the alicyclic olefin polymer (A1) with respect to the solid content as a whole when made into a plateable layer becomes 50 to 90 wt %, preferably 52 to 80 wt %, more preferably 55 to 70 wt %. In the present invention, by making the ratio of content of the alicyclic olefin polymer (A1) in the plateable layer in the above range, it is possible to improve the via hole formability of the cured article obtained by curing the insulating adhesive film and, further, becomes possible to keep the surface roughness low while improving the peel strength. If the ratio of content of the alicyclic olefin polymer (A1) in the plateable layer is less than 50 wt %, the problem of the via hole formability falling and the roughening of the via hole opening edges or the problem of the surface roughness after the roughening treatment becoming greater, the peel strength becoming smaller, and the plating adhesion ending up falling end up occurring. On the other hand, if the ratio of content of the alicyclic olefin polymer (A1) exceeds 90%, the problem arises that the peel strength is small and the plating adhesion ends up falling.

(Curing Agent (A2))

The curing agent (A2) used in the present invention is not particularly limited. It is possible to use a curing agent which is mixed into a resin composition for forming a general electrical insulating film. As the curing agent (A2), it is preferable to use a compound which has two or more functional groups which can react and form bonds with the polar groups which are provided in the alicyclic olefin polymer (A1).

For example, when using an alicyclic olefin polymer (A1) constituted by an alicyclic olefin polymer (A1) which has carboxyl groups, carboxylic anhydride groups or phenolic hydroxyl groups, as the curing agent which is used, polyepoxy compounds, polyisocyanate compounds, polyamine compounds, polyhydrazide compounds, aziridine compounds, basic metal oxides, organometallic halides, etc. may be mentioned. These may be used alone or may be used in two or more types. Among these, from the viewpoint of the reactivity with the polar groups of the alicyclic olefin polymer (A1) being mild and the ease of handling of the resin composition, polyvalent epoxy compounds are preferable.

As the polyepoxy compounds, for example, phenol novolac type epoxy compounds, cresol novolac type epoxy compounds, cresol type epoxy compounds, bisphenol A type epoxy compounds, bisphenol F type epoxy compounds, hydrogenated bisphenol A type epoxy compounds, and other glycidyl ether type epoxy compounds; alicyclic epoxy compounds, glycidyl ester type epoxy compounds, glycidyl amine type epoxy compounds, fluorene-type epoxy compounds, polyfunctional epoxy compounds, isocyanulate type epoxy compounds, phosphorus-containing epoxy compounds, and other polyepoxy compounds; and other compounds which have two or more epoxy groups in their molecules may be mentioned. These may be used alone or may be used in two or more types. Among these, from the viewpoint of enabling the insulating adhesive film of the present invention and the prepreg, laminate, and cured article which are obtained using the same to be made excellent in mechanical properties, bisphenol A type epoxy compounds, polyphenol type epoxy compounds, or epoxy resins which have alicyclic olefin structures or fluorene structures are preferable. Furthermore, from the viewpoint of making the resin composition excellent in resin fluidity, epoxy resins which have an alicyclic olefin structure are particularly preferable. Note that, these may be used alone or may be used in two or more types.

As the bisphenol A type epoxy compounds, for example, product names "jER827, jER828, jER828EL, jER828XA, and jER834" (above all made by Mitsubishi Chemical Corporation), product names "EPICLON 840, EPICLON 840-S, EPICLON 850, EPICLON 850-S, and EPICLON 850-LC" (above all made by DIC Corporation, "EPICLON" is a registered trademark), etc. may be mentioned. As the polyphenol type epoxy compound, for example, product names "1032H60 and XY-4000" (above all made by Mitsubishi Chemical Corporation), etc. may be mentioned. As epoxy resins which have alicyclic olefin structures or fluorene structures, epoxy resins which have dicyclopentadiene frameworks (for example, product names "EPICLON HP7200L, EPICLON HP7200, EPICLON HP7200H, EPICLON HP7200HH, and EPICLON HP7200HHH" (above all made by DIC Corporation); product name "Tactix 558" (made by Huntsman Advanced Materials); product names "XD-1000-1L and XD-1000-2L" (above all made by Nippon Kayaku Co., Ltd.)), epoxy resins which have fluorene frameworks (for example, product names "Oncoat EX-1010, Oncoat EX-1011, Oncoat EX-1012, Oncoat EX-1020, Oncoat EX-1030, Oncoat EX-1040, Oncoat EX-1050, and Oncoat EX-1051" (above all made by NAGASE & CO., LTD. "Oncoat" is a registered trademark); product names "OGSOL PG-100, OGSOL EG-200, and OGSOL EG-250)" (above all made by Osaka Gas Chemicals, Co., Ltd. "OGSOL" is a registered trademark)), etc. may be mentioned.

As the polyisocyanate compounds, $C_6$ to $C_{24}$ diisocyanates and triisocyanates are preferable. As examples of diisocyanates, 2,4-tolylene diisocyanate, 2,6-tolylene diisocyanate, 4,4'-diphenylmethane diisocyanate, hexamethylene diisocyanate, p-phenylene diisocyanate, etc. may be mentioned. As examples of the triisocyanates, 1,3,6-hexamethylene triisocyanate, 1,6,11-undecane triisocyanate, bicycloheptane triisocyanate, etc. may be mentioned. These may be used alone or may be used in two or more types.

As the polyamine compounds, $C_4$ to $C_{20}$ aliphatic polyamine compounds which have two or more amino groups, aromatic polyamine compounds, etc. may be mentioned. Ones, like guanidine compounds, which have unconjugated nitrogen-carbon double bonds are not included. As the aliphatic polyamine compounds, hexamethylene diamine, N,N'-dicinnamylidene-1,6-hexane diamine, etc. may be mentioned. As the aromatic polyamine compounds, 4,4'-methylenedianiline, m-phenylenediamine, 4,4'-diaminodiphenylether, 4'-(m-phenylenediisopropylidene)dianiline, 4,4'-(p-phenylenediisopropylidene)dianiline, 2,2'-bis[4-(4-aminophenoxy)phenyl]propane, 1,3,5-benzenetriamine, etc. may be mentioned. These may be used alone or may be used in two or more types.

As examples of polyhydrazide compounds, isophthalic acid dihydrazide, terephthalic acid dihydrazide, 2,6-naphthalenedicarboxylic acid dihydrazide, maleic acid dihydrazide, itaconic acid dihydrazide, trimellitic acid dihydrazide, 1,3,5-benzenetricarboxylic acid dihydrazide, pyromellitic acid dihydrazide, etc. may be mentioned. These may be used alone or may be used in two or more types.

As aziridine compounds, tris-2,4,6-(1-aziridinyl)-1,3,5-triazine, tris[1-(2-methyl)aziridinyl]phosphinoxide, hexa[1-(2-methyl)aziridinyl]triphosphatriazine, etc. may be mentioned. These may be used alone or may be used in two or more types.

Among the above-mentioned curing agents, from the viewpoint of the reactivity with the polar groups of the alicyclic olefin polymer (A1) being mild and the ease of handling of the resin composition, polyepoxy compounds are preferable, while glycidyl ether type epoxy compounds and alicyclic polyepoxy compounds are particularly preferably used.

The amount of the curing agent (A2) in the plateable layer-use resin composition used in the present invention is preferably made a range such that the ratio of content of the curing agent (A2) to the solid content as a whole when made into a plateable layer becomes preferably 5 to 50 wt %, more preferably 10 to 40 wt %, furthermore preferably 15 to 30 wt %. By making the ratio of content of the curing agent (A2) in the plateable layer the above range, it is possible to make the cured article which is obtained by curing the insulating adhesive film excellent in mechanical strength and electrical properties, so this is preferred.

(Inorganic Filler (A3))

Further, the plateable layer-use resin composition used in the present invention preferably further contains an inorganic filler (A3), in addition to the alicyclic olefin polymer (A1) and the curing agent (A2). By further including the inorganic filler (A3), it is possible to make the insulating adhesive film lower in linear expansion coefficient.

The inorganic filler (A3) used in the present invention is not particularly limited, but, for example, calcium carbonate, magnesium carbonate, barium carbonate, zinc oxide, titanium oxide, magnesium oxide, magnesium silicate, calcium silicate, zirconium silicate, hydrated alumina, magnesium hydroxide, aluminum hydroxide, barium sulfate, silica, talc, clay, etc. may be mentioned. Among these as well, ones which do not degrade or dissolve due to acidic compounds such as the aqueous solution of permanganate which is used for the surface roughening treatment of the cured article are preferable. In particular, silica is preferable. This is because if the aqueous solution of permanganate or other acidic compound causes the inorganic filler to degrade or dissolve, the etching will result in deep holes being formed.

Further, in the present invention, as the inorganic filler (A3) which is contained in the plateable layer-use resin composition, untreated inorganic filler which is not treated on its surfaces using a coupling agent etc. or otherwise substantially treated to change the surface properties is preferable. By using such an untreated inorganic filler, it is possible to easily roughen the surface of the plateable layer at the time of making into the cured article. Due to this, it is possible to balance the surface roughness and the peel strength to a high degree.

Furthermore, as the inorganic filler (A3), a nonconductive one which does not cause the obtained electrical insulating layer to drop in dielectric characteristics is preferable. Further, the inorganic filler (A3) is not particularly limited in shape. A spherical shape, fiber shape, plate shape, etc. are also possible, but to make the dispersability and the resin fluidity of the resin composition better, a fine spherical shape is preferable.

The inorganic filler (A3) has an average particle diameter of preferably 0.1 to 0.5 µm, more preferably 0.15 to 0.4 µm. By making the inorganic filler (A3) one with an average particle diameter in the above range, it is possible to make the surface roughness of the insulating adhesive film a more suitable range. Note that, the average particle size can be measured by a particle size distribution measurement apparatus.

The amount of the inorganic filler (A3) in the plateable layer-use resin composition used in the present invention is preferably made a range such that the ratio of content of the inorganic filler (A3) with respect to the solid content as a whole when made into a plateable layer becomes preferably 1 to 40 wt %, more preferably 2 to 30 wt %, furthermore preferably 3 to 25 wt %. By making the ratio of content of the inorganic filler (A3) in the plateable layer in the above range, it is possible to keep the surface roughness after the roughening treatment of the cured article which is obtained by curing the insulating adhesive film low while raising more the effect of reduction of the linear expansion coefficient.

(Other Ingredients)

Further, the plateable layer-use resin composition used in the present invention may, in accordance with need, contain a curing accelerator. The curing accelerator is not particularly limited, but, for example, an aliphatic polyamine, aromatic polyamine, secondary amine, tertiary amine, imidazole derivative, organic acid hydrazide, dicyan diamide and its derivatives, urea derivatives, etc. may be mentioned. Among these, an imidazole derivative is particularly preferable.

The imidazole derivative is not particularly limited so long as it is a compound which has an imidazole structure, but, for example, 2-ethylimidazole, 2-ethyl-4-methylimidazole, bis-2-ethyl-4-methylimidazole, 1-methyl-2-ethylimidazole, 2-isopropylimidazole, 2,4-dimethylimidazole, 2-heptadecylimidazole, and other alkyl substituted imidazole compounds; 2-phenylimidazole, 2-phenyl-4-methylimidazole, 1-benzyl-2-methylimidazole, 1-benzyl-2-ethylimidazole, 1-benzyl-2-phenylimidazole, benzimidazole, 2-ethyl-4-methyl-1-(2'-cyanoethyl)imidazole, and other imidazole compounds which are substituted by hydrocarbon groups which contain ring structures such as aryl groups or aralkyl groups etc. may be mentioned. These may be used as single type alone or as two or more types combined.

The amount when mixing in a curing accelerator may be suitably selected in accordance with the purpose of use, but is preferably 0.1 to 20 parts by weight with respect to 100 parts by weight of the alicyclic olefin polymer (A1), more preferably 0.1 to 10 parts by weight, furthermore preferably 0.1 to 5 parts by weight.

Furthermore, the plateable layer-use resin composition used in the present invention may include, for the purpose of improving the flame retardance of the insulating adhesive film, for example, a halogen-containing flame retardant or a phosphoric acid ester flame retardant or another flame retardant which is mixed into a resin composition for formation of a general electrical insulating film. The amount when mixing in a flame retardant is preferably 100 parts by weight or less with respect to 100 parts by weight of the alicyclic olefin polymer (A1), more preferably 60 parts by weight or less.

Further, the plateable layer-use resin composition used in the present invention may contain, furthermore, in accordance with need, a flame retardant aid, heat resistance stabilizer, weather resistance stabilizer, antiaging agent, UV absorber (laser processing enhancing agent), leveling agent, antistatic agent, slip agent, antiblocking agent, anticlouding agent, lubricant, dye, natural oil, synthetic oil, wax, emulsifying agent, magnetic material, dielectric characteristic adjuster, toughening agent, or other ingredient. The ratios of these optional ingredients added may be suitably selected in a range not detracting from the object of the present invention.

The method of production of the plateable layer-use resin composition used in the present invention is not particularly limited. The above ingredients may be mixed as they are or may be mixed in the state dissolved or dispersed in an organic solvent. Part of the ingredients may be dissolved or dispersed in an organic solvent to prepare a composition and the remaining ingredients may be mixed into that composition.

(Adhesive Layer-Use Resin Composition)

Next, the adhesive layer-use resin composition for forming the adhesive layer will be explained. The adhesive layer-use resin composition used in the present invention contains a polar group-containing alicyclic olefin polymer (B1), curing agent (B2), and inorganic filler (B3).

(Alicyclic Olefin Polymer (B1))

The adhesive layer-use resin composition used in the present invention contains a polar group-containing alicyclic olefin polymer (B1) as a resin ingredient.

The polar group-containing alicyclic olefin polymer (B1) (below, suitably abbreviated as "alicyclic olefin polymer (B1)") is not particularly limited so long as an alicyclic olefin polymer which has polar groups, but, for example, one which is similar to the polar group-containing alicyclic olefin polymer (A1) which is used for the above plateable layer-use resin composition can be used.

In the adhesive layer-use resin composition used in the present invention, the amount of the alicyclic olefin polymer (B1) is preferably made a range such that the ratio of content of the alicyclic olefin polymer (B1) when made into an adhesive layer becomes 1 to 30 wt %, preferably 1.5 to 20 wt %, more preferably 2 to 10 wt %. In the present invention, by making the ratio of content of the alicyclic olefin polymer (B1) in the adhesive layer in the above range, it is possible to make the cured article which is obtained by curing the insulating adhesive film excellent in via hole formability and furthermore possible to keep the linear expansion coefficient low. Due to this, it is possible to make the cured article excellent in heat resistance. If the ratio of content of the alicyclic olefin polymer (B1) in the adhesive layer becomes less than 1 wt %, the insulating adhesive film and the cured article which is obtained using the same end up greatly falling in strength. On the other hand, if the ratio of content of the alicyclic olefin polymer (B1) in the adhesive layer exceeds 30 wt %, the problem of the via hole formability falling and the ratio of top diameter/bottom diameter of the via holes which are formed ending up deteriorating or the problem of the linear expansion coefficient becoming higher and the heat resistance ending up becoming inferior end up occurring.

The amount of the alicyclic olefin polymer (B1) in the adhesive layer-use resin composition used in the present invention is preferably made a range whereby the ratio of content of the alicyclic olefin polymer (B1) with respect to the amount of the solid content as a whole with the exception of the inorganic filler (B3) when made into an adhesive layer becomes 20 wt % or less, preferably 0.5 to 15 wt %, more preferably 1 to 10 wt %. In the present invention, by making the ratio of content of the alicyclic olefin polymer (B1) in the above range, it is possible to make the cured article which is obtained by curing the insulating adhesive film excellent in via hole formability and further possible to keep the linear expansion coefficient low. Due to this, it is possible to make the cured article excellent in heat resistance. If the ratio of content of the alicyclic olefin polymer (B1) with respect to the amount of the solid content as a whole with the exception of the inorganic filler (B3) in the adhesive layer exceeds 20 wt %, there is a possibility of occurrence of the problem of the via hole formability falling and the ratio of top diameter/bottom diameter of the via holes which are formed ending up deteriorating or the problem of the linear expansion coefficient becoming higher and the heat resistance ending up becoming inferior.

(Curing Agent (B2))

The curing agent (B2) is not particularly limited and need only be a compound which has functional groups which can react and form bonds with the polar groups provided in the above alicyclic olefin polymer (B1), but, for example, one similar to the curing agent (A2) which is used for the above-mentioned plateable layer-use resin composition can be used.

In the adhesive layer-use resin composition used in the present invention, the amount of the curing agent (B2) is preferably made a range such that the ratio of content of the curing agent (B2) to the solid content as a whole when made into an adhesive layer becomes preferably 3 to 35 wt %, more preferably 5 to 30 wt %, furthermore preferably 10 to 25 wt %. By making the ratio of content of the curing agent (B2) in the adhesive layer in the above range, the cured article which is obtained by curing the insulating adhesive film can be made excellent in mechanical strength and electrical characteristics, so this is preferred.

(Inorganic Filler (B3))

The inorganic filler (B3) used in the present invention is not particularly limited, but, for example, calcium carbonate, magnesium carbonate, barium carbonate, zinc oxide, titanium oxide, magnesium oxide, magnesium silicate, calcium silicate, zirconium silicate, hydrated alumina, magnesium hydroxide, aluminum hydroxide, barium sulfate, silica, talc, clay, etc. may be mentioned. Among these as well, ones which do not degrade or dissolve due to acidic compounds such as the aqueous solution of permanganate which is used for the surface roughening treatment of the cured article are preferable. In particular, silica is preferable. This is because if the aqueous solution of permanganate or other acidic compound causes the inorganic filler to degrade or dissolve, the etching will result in deep holes being formed.

Further, in the present invention, as the inorganic filler (B3) which is included in the adhesive layer-use resin composition, an inorganic filler which is obtained by treatment of its surface by a surface treatment agent is preferable. It is possible to further improve the cured article which is obtained by curing an insulating adhesive film in the via hole formability, in particular the desmearing resistance of the via holes.

In the inorganic filler (B3) used in the present invention, the surface treatment agent which is used for the surface treatment is not particularly limited, but a silane coupling agent or stearic acid or another organic acid etc. may be mentioned, but from the viewpoint of the excellent dispersability of the inorganic filler and the good fluidity of the resin composition, a silane coupling agent is preferable.

The silane coupling agent is not particularly limited, but a silane coupling agent which has functional groups which can react with the polar groups provided in the alicyclic olefin polymer (B1) is preferable. As such functional groups, for example, an amino group, carboxyl group, methacryloyl group, isocyanate group, epoxy group, etc. may be mentioned. Among these, an amino group, carboxyl group, and epoxy group are preferable, while an amino group is more preferable.

When using a silane coupling agent as a surface treatment agent, the amount of surface treatment of the inorganic filler (B3) is preferably 0.1 to 2 wt % based on the amount of the inorganic filler before the surface treatment (100 wt %), more preferably 0.5 to 1.5 wt %.

Further, as the inorganic filler (B3), a nonconductive one which does not cause the obtained electrical insulating layer to drop in dielectric characteristics is preferable. Further, the inorganic filler (B3) is not particularly limited in shape. A spherical shape, fiber shape, plate shape, etc. are also possible, but to make the dispersability and the resin fluidity of the resin composition better, a fine spherical shape is preferable.

The inorganic filler (B3) has an average particle diameter of preferably 0.2 to 3 µm, more preferably 0.25 to 1 µm. By using the inorganic filler (B3) having an average particle diameter in the above range, it is possible to better enhance the via hole formability of the insulating adhesive film and the cured article obtained by using it.

The amount of the inorganic filler (B3) in the adhesive layer-use resin composition used in the present invention is preferably made a range such that the ratio of content of the inorganic filler (B3) with respect to the solid content as a whole when made into an adhesive layer becomes 50 to 90 wt %, preferably 55 to 80 wt %, more preferably 60 to 70 wt %. In the present invention, by making the ratio of content of the inorganic filler (B3) in the adhesive layer in the above range, it is possible to make the cured article which is obtained by curing the insulating adhesive film excellent in via hole formability and further possible to keep the linear expansion coefficient low and thereby possible to make the cured article excellent in heat resistance. If the ratio of content of the inorganic filler (B3) in the adhesive layer becomes less than 50 wt %, the problem of the via hole formability falling and the ratio of the top diameter/bottom diameter of the via holes formed ending up deteriorating or the problem of the linear expansion coefficient becoming higher and the heat resistance ending up becoming inferior end up occurring. On the other hand, if the ratio of content of the inorganic filler (B3) in the adhesive layer exceeds 90 wt %, the problem of the fluidity of the resin composition falling and the adhesion deteriorating ends up occurring.

(Other Ingredients)

Further, the adhesive layer-use resin composition used in the present invention, in the same way as the above-mentioned plateable layer-use resin composition, may contain, for example, a curing accelerator or a flame retardant and, furthermore, in accordance with need, may contain a flame retardant aid, heat resistance stabilizer, weather resistance stabilizer, antiaging agent, UV absorber (laser processing enhancing agent), leveling agent, antistatic agent, slip agent, antiblocking agent, anticlouding agent, lubricant, dye, natural oil, synthetic oil, wax, emulsifying agent, magnetic material, dielectric characteristic adjuster, toughening agent, or another other ingredient. The ratios of these optional ingredients added may be suitably selected in a range not detracting from the object of the present invention.

The method of production of the adhesive layer-use resin composition used in the present invention is not particularly limited. The above ingredients may be mixed as they are or may be mixed in the state dissolved or dispersed in an organic solvent. Part of the ingredients may be dissolved or dispersed in an organic solvent to prepare a composition and the remaining ingredients may be mixed into that composition.

(Insulating Adhesive Film)

The insulating adhesive film of the present invention has a plateable layer which is comprised of the above-mentioned plateable layer-use resin composition and an adhesive layer which is comprised of the above-mentioned adhesive layer-use resin composition.

The insulating adhesive film of the present invention can be produced by, for example, the following two methods: (1) the method of coating, spraying, or casting the above-mentioned plateable layer-use resin composition on a support and, if necessary, drying it, then further coating or casting the above-mentioned adhesive layer-use resin composition on it and, if necessary, drying it and (2) the method of laminating a plateable layer-use shaped article obtained by coating, spraying, or casting the above-mentioned plateable layer-use resin composition on a support and, if necessary, drying it to be a sheet shape or film shape and an adhesive layer-use shaped article obtained by coating, spraying, or casting the above-mentioned adhesive layer-use resin composition on a support and, if necessary, drying it to be a sheet shape or film shape and joining these shaped articles. Among these methods of production, due to the easier process and the better productivity, the method of production of the above (1) is preferable.

In the method of production of the above-mentioned (1), when coating, spraying, or casting the plateable layer-use resin composition on the support and when coating, spraying, or casting the adhesive layer-use resin composition on the coated, sprayed, or cast plateable layer-use resin composition or, in the method of production of the above-mentioned (2), when shaping the plateable layer-use resin composition and the adhesive layer-use resin composition into sheet shapes or film shapes to obtain the plateable layer-use shaped article and adhesive layer-use shaped article, it is preferable to coat, spray, or cast the plateable layer-use resin composition or the adhesive layer-use resin composition on the support while adding an organic solvent as needed.

As the support which is used at this time, a resin film or metal foil etc. may be mentioned. As the resin film, a polyethylene terephthalate film, polypropylene film, polyethylene film, polycarbonate film, polyethylene naphthalate film, polyarylate film, nylon film, etc. may be mentioned. Among these films, from the viewpoint of the heat resistance, chemical resistance, peel property, etc., a polyethylene terephthalate film or polyethylene naphthalate film is preferable. As the metal foil, copper foil, aluminum foil, nickel foil, chrome foil, gold foil, silver foil, etc. may be mentioned. Note that, the surface roughness Ra of the support is usually 300 nm or less, preferably 150 nm or less, more preferably 100 nm or less.

The thicknesses of the plateable layer-use resin composition and the adhesive layer-use resin composition in the method of production of the above-mentioned (1) and the thicknesses of the plateable layer-use shaped article and adhesive layer-use shaped article in the method of production of the above-mentioned (2) are not particularly limited, but the thickness of the plateable layer when made into an insulating adhesive film is preferably 1 to 10 μm, more preferably 1 to 8 furthermore preferably 2 to 5 μm, while the thickness of the adhesive layer is preferably 10 to 100 μm, more preferably 10 to 80 μm, furthermore preferably 15 to 60 μm. If the thickness of the plateable layer is too thin, when forming a conductor layer by electroless plating on a cured article which is obtained by curing the insulating adhesive film, the formability of the conductor layer is liable to end up falling, while if the thickness of the plateable layer is too thick, the cured article which is obtained by curing the insulating adhesive film is liable to become larger in linear expansion. Further, if the thickness of the adhesive layer is too small, the ability of the insulating adhesive film to bury wiring is liable to end up falling.

As the method of coating the plateable layer-use resin composition and the adhesive layer-use resin composition, dip coating, roll coating, curtain coating, die coating, slit coating, gravure coating, etc. may be mentioned.

Further, in the method of production of the above-mentioned (1), after the plateable layer-use resin composition is coated, sprayed, or cast on the support or after the adhesive layer-use resin composition is coated, sprayed, or cast on the plateable layer-use resin composition or, in the method of production of the above-mentioned (2), after the plateable layer-use resin composition and the adhesive layer-use resin composition are coated on the supports, the compositions may be dried as needed. The drying temperature is preferably made a temperature of an extent where the plateable layer-use resin composition and the adhesive layer-use resin composition will not cure and is normally 20 to 300° C., preferably 30 to 200° C. Further, the drying time is normally 30 seconds to 1 hour, preferably 1 minute to 30 minutes.

Note that, in the insulating adhesive film of the present invention, the plateable layer and adhesive layer which form the insulating adhesive film are preferably uncured or semicured in state. By making these uncured or semicured in state, it is possible to make the adhesive layer which forms the insulating adhesive film of the present invention one which is high in adhesiveness. Here, "uncured" means the state where when the insulating adhesive film of the present invention is respectively dipped in a solvent which can dissolve the alicyclic olefin polymer (A1) and a solvent which can dissolve the alicyclic olefin polymer (B1), substantially all of the alicyclic olefin polymer (A1) and alicyclic olefin polymer (B1) are dissolved. Further, "semicured" means the state of being partially cured to an extent enabling further curing upon heating, preferably a state where parts of the alicyclic olefin polymer (A1) and alicyclic olefin polymer (B1) (specifically, amounts of 7 wt % or more and amounts where parts remain) dissolve in respectively a solvent which can dissolve the alicyclic olefin polymer (A1) and a solvent which can dissolve the alicyclic olefin polymer (B1) or a state where the volume after dipping the shaped article in a solvent for 24 hours is 200% or more of the volume before dipping (swell rate).

(Prepreg)

The prepreg of the present invention is comprised of the above-mentioned insulating adhesive film of the present invention and a fiber base material and is an insulating composite article where one surface of the prepreg is comprised of an adhesive layer comprised of the above-mentioned adhesive layer-use resin composition and the other surface is comprised of a plateable layer comprised of the above-mentioned plateable layer-use resin composition.

As the fiber base material, polyamide fiber, polyaramide fiber, polyester fiber, or other organic fiber or glass fiber, carbon fiber, or other inorganic fiber may be mentioned. Further, as the form of the fiber base material, a flat weave or twill weave or other woven fabric or nonwoven fabric etc. may be mentioned. The fiber base material has a thickness of preferably 5 to 100 µm, more preferably 10 to 50 µm. If too thin, the handling becomes difficult, while if too thick, the resin layer becomes relatively thin and its ability to bury wiring sometimes becomes insufficient.

The prepreg of the present invention is not limited in method of production so long as having an adhesive layer at one surface, a plateable layer at the other surface, and a fiber base material at the inside, but for example can be produced by the following methods: (1) the method of stacking an adhesive layer-use resin composition film with support and a plateable layer-use resin composition film with a support to sandwich a fiber base material between them with the resin layer sides of the films facing each other and laminating them as needed under pressure, vacuum, heating, or other conditions; (2) the method of impregnating either the adhesive layer-use resin composition or plateable layer-use resin composition in a fiber base material and drying it as required so as to prepare a prepreg and coating, spraying, or casting the other resin composition on this prepreg or stacking the other resin composition film with a support; or (3) the method of coating, spraying, or casting, either the adhesive layer-use resin composition or plateable layer-use resin composition to a support to form a layer, placing a fiber base material over it, and further coating, spray, or casting the other resin composition over that to form a layer and drying if necessary. Note that, in each method, it is preferable to add an organic solvent to the compositions as required to adjust the viscosities of the compositions and thereby control the workability when impregnating them in the fiber base material or coating, spraying, or casting them on the support.

Further, as the support which is used at this time, a polyethylene terephthalate film, polypropylene film, polyethylene film, polycarbonate film, polyethylene naphthalate film, polyarylate film, nylon film, or other resin film or copper foil, aluminum foil, nickel foil, chrome foil, gold foil, silver foil, or other metal foil may be mentioned. These may be applied to either just one surface of the prepreg or to both surfaces.

The prepreg of the present invention is not particularly limited in thickness, but is preferably made a thickness such that the thickness of the plateable layer becomes preferably 1 to 10 µm, more preferably 1.5 to 8 µm, furthermore preferably 2 to 5 µm and, further, the thickness of the adhesive layer becomes preferably 10 to 100 µm, more preferably 10 to 80 µm, furthermore preferably 15 to 60 µm.

When producing the prepreg of the present invention, as the method of coating the plateable layer-use resin composition and the adhesive layer-use resin composition, dip coating, roll coating, curtain coating, die coating, slit coating, gravure coating, etc. may be mentioned.

Further, in the prepreg of the present invention, in the same way as the insulating adhesive film of the present invention, the resin compositions which form the plateable layer and adhesive layer are preferably in the uncured or semicured state.

(Laminate)

The laminate of the present invention is one obtained by laminating the above-mentioned insulating adhesive film or prepreg of the present invention on a base material. The laminate of the present invention need only be one obtained by laminating at least the insulating adhesive film or prepreg of the present invention, but is preferably one obtained by laminating a substrate which has a conductor layer on its surface and an electrical insulating layer which is comprised of a cured article of the insulating adhesive film or prepreg of the present invention. Note that, at this time, the insulating adhesive film or prepreg of the present invention is laminated on the substrate via an adhesive layer. That is, in the laminate of the present invention, the surface of the electrical insulating layer is formed by the plateable layer among the plateable layer and adhesive layer of the insulating adhesive film or prepreg of the present invention.

The substrate which has a conductor layer on its surface is one which has a conductor layer on the surface of an electrical insulating substrate. The electrical insulating substrate is formed by curing a resin composition which contains a known electrical insulating material (for example, alicyclic olefin polymer, epoxy resin, maleimide resin, (meth)acrylic resin, diallyl phthalate resin, triazine resin, polyphenyl ether, glass, etc.). The conductor layer is not particularly limited, but is usually a layer which includes wiring which are formed by a conductive metal or other conductor and may further include various circuits as well. The configurations, thicknesses, etc. of the wiring and circuits are not particularly limited. As specific examples of a substrate which has a conductor layer on its surface, a printed circuit board, silicon wafer board, etc. may be mentioned. The substrate which has a conductor layer on its surface has a thickness of usually 10 µm to 10 mm, preferably 20 µm to 5 mm, more preferably 30 µm to 2 mm.

The substrate which has a conductor layer on its surface used in the present invention is preferably pretreated on the surface of the conductor layer so as to improve the adhesion with the electrical insulating layer. As the method of pretreatment, known art can be used without particular limitation. For example, if the conductor layer is comprised of copper, the oxidizing method of bringing a strong alkaline oxidizing solution into contact with the conductor layer surface to form a layer of copper oxide on the conductor surface and roughen it, the method of oxidizing the conductor layer surface by the previous method, then reducing it by sodium borohydride, formalin, etc., the method of depositing plating on the conductor layer to roughen it, the method of bringing an organic acid into contact with the conductor layer to dissolve the grain boundaries of the copper and roughen the layer, the method of forming a primer layer on the conductor layer by a thiol compound, silane compound, etc. and the like may be mentioned. Among these, from the viewpoint of the ease of maintaining the shapes of fine wiring patterns, the method of bringing an organic acid into contact with the conductor layer to dissolve the grain boundaries of the copper and roughen the layer and the method of using thiol compounds or silane compounds etc. to form a primer layer are preferable.

The laminate of the present invention can usually be produced by hot pressing the insulating adhesive film or prepreg of the present invention on a substrate which has a conductor layer on its surface.

As the method of hot pressing, the method of superposing an insulating adhesive film with a support or prepreg so that the adhesive layer which forms part of the insulating adhesive film or prepreg is contiguous with the conductor layer of the substrate explained above and using a press laminator, press machine, vacuum laminator, vacuum press, roll laminator, or other pressure device for hot pressing (lamination) may be mentioned. By hot pressing, it is possible to join the conductor layer on the substrate surface and the insulating adhesive film with substantially no clearance at their interface.

The temperature of the hot pressing operation is usually 30 to 250° C., preferably 70 to 200° C., the applied pressure is usually 10 kPa to 20 MPa, preferably 100 kPa to 10 MPa, and the pressing time is usually 30 seconds to 5 hours, preferably 1 minute to 3 hours. Further, the hot pressing is preferably performed under reduced pressure so as to improve burying interconnect patterns into the insulating adhesive film or prepreg and prevent the formation of bubbles. The pressure of the reduced pressure under which the hot pressing is performed is usually 100 kPa to 1 Pa, preferably 40 kPa to 10 Pa. According to the above hot pressing operation, by suitably adjusting the temperature conditions etc., it is possible to laminate the insulating adhesive film or prepreg of the present invention on a base material in the uncured state, semicured state, or cured state.

(Cured Article)

The cured article of the present invention is obtained by treating the insulating adhesive film, prepreg, or laminate of the present invention which are obtained by the abovementioned methods so as to cure them. The curing can be performed by, for example, heating the film etc. in a temperature range shown in the hot pressing operation in the method of production of the laminate. The curing is performed, for example, in the laminate of the present invention, usually by heating the substrate as a whole on the conductor layer of which the insulating adhesive film or prepreg of the present invention is laminated. Further, the curing can be performed at the same time as the abovementioned hot press operation. Note that, the curing treatment may be performed in a stepwise manner. For example, first the hot pressing operation may be performed under conditions not causing curing, that is, at a relatively low temperature and a short time, then the curing performed.

(Composite Article)

The composite article of the present invention is comprised of the cured article of the present invention on the surface of which, specifically on the plateable layer of the cured article, electroless plating is used to further form a conductor layer. Below, the method of production of a composite article of the present invention will be explained while illustrating a multilayer circuit board as one example of the composite article of the present invention. In the multilayer circuit board, the cured article of the insulating adhesive film (or prepreg) of the present invention forms an electrical insulating layer.

First, the laminate is formed with via holes or through holes which pass through the electrical insulating layer. The via holes are formed for connecting the different conductor layers which form a multilayer circuit board when forming a multilayer circuit board. The via holes and through holes can be formed by chemical treatment such as photolithography or by physical treatment such as drilling, laser irradiation, and plasma etching. Among these methods, the method using a laser ($CO_2$ gas laser, excimer laser, UV-YAG laser, etc.) enables fine via holes to be formed without causing a drop in the characteristics of the electrical insulating layer, so this is preferred.

Next, the electrical insulating layer of the laminate, specifically the surface of the plateable layer of the insulating adhesive film which forms part of the laminate, is roughened by surface roughening treatment. The surface roughening treatment is performed so as to enhance the adhesion with the conductor layer which is formed on the electrical insulating layer.

The electrical insulating layer has a surface average roughness Ra of preferably 0.05 μm or more and less than 0.5 μm, more preferably 0.06 μm or more and 0.3 μm or less, while the surface 10-point average roughness Rzjis is preferably 0.3 μm or more and 4 μm or less, more preferably 0.5 μm or more and 2 μm or less. Note that, in this Description, Ra is the arithmetic average roughness which is shown in JIS B 0601-2001. The surface 10-point average roughness Rzjis is the 10-point average roughness which is shown in JIS B 0601-2001 Annex 1.

The method of surface roughening treatment is not particularly limited, but the method of bringing the surface of the electrical insulating layer (that is, the surface of the plateable layer of the cured article of the insulating adhesive film) into contact with an oxidizing compound etc. may be mentioned. As the oxidizing compound, an inorganic oxidizing compound or organic oxidizing compound or other known compound which has an oxidizing ability may be mentioned. From the ease of control of the surface average roughness of the electrical insulating layer, use of an inorganic oxidizing compound or organic oxidizing compound is particularly preferable. As the inorganic oxidizing compound, a permanganate, chromic acid anhydride, dichromate, chromate, persulfate, active manganese dioxide, osmium tetraoxide, hydrogen peroxide, periodide, etc. may be mentioned. As the organic oxidizing compound, dicumyl peroxide, octanoyl peroxide, chloroperbenzoate, peracetate, ozone, etc. may be mentioned.

The method of using an inorganic oxidizing compound or organic oxidizing compound to roughen the surface of the electrical insulating layer is not particularly limited. For example, the method of dissolving the above oxidizing compound in a solvent which can dissolve it so as to prepare an oxidizing compound solution and bringing this into contact with the surface of the electrical insulating layer may be mentioned.

The method of bringing the oxidizing compound solution into contact with the surface of the electrical insulating layer is not particularly limited, but, for example, the dipping method of dipping the electrical insulating layer in the oxidizing compound solution, the buildup method of utilizing the surface tension of the oxidizing compound solution to place the oxidizing compound solution on the electrical insulating layer, the spraying method of spraying the oxidizing compound solution on the electrical insulating layer, or any other method may also be used. By performing the surface roughening treatment, it is possible to improve the adhesion of the electrical insulating layer with the conductor layer and other layers.

The temperature and the time by which these oxidizing compound solutions are brought into contact with the surface of the electrical insulating layer may be freely set by considering the concentration and type of the oxidizing compound, method of contact, etc., but the temperature is usually 10 to 150° C., preferably 20 to 100° C., while the time is usually 0.5 to 60 minutes, preferably 1 to 40 minutes.

Note that, to remove the oxidizing compound after the surface roughening treatment, the surface of the electrical insulating layer after the surface roughening treatment is washed with water. Further, when a substance which cannot be washed off by just water is deposited on the surface, the surface is further washed by a washing solution which can dissolve that substance or another compound is brought into contact with the surface to convert the substance into one which can be dissolved in water and then the surface is washed by water. For example, when bringing an aqueous solution of potassium permanganate or an aqueous solution of sodium permanganate or other alkali aqueous solution into contact with the electrical insulating layer, to remove the film of manganese dioxide which is formed, it is possible to using a mixed solution of hydroxylamine sulfate and sulfuric acid or other acidic aqueous solution to neutralize/reduce the surface, then wash it by water.

Next, after the electrical insulating layer of the laminate is treated to roughen its surface, a conductor layer is formed on the surface of the electrical insulating layer (that is, the surface of the plateable layer of the cured article of the insulating adhesive film) and the inside wall surfaces of the via holes or through holes.

The method of formation of the conductor layer is performed, from the viewpoint of enabling formation of a conductor layer which is excellent in adhesion, using the electroless plating method.

For example, when using electroless plating to form a conductor layer, first, before forming a metal thin layer on the surface of the electrical insulating layer, the general practice has been to deposit silver, palladium, zinc, cobalt, or another catalyst nuclei on the electrical insulating layer (that is, the plateable layer of the cured article of the insulating adhesive film). The method of depositing catalyst nuclei on the electrical insulating layer is not particularly limited, but, for example, the method of dipping the article in a solution obtained by dissolving silver, palladium, zinc, cobalt, or other metal compounds or their salts or complexes in water, alcohol, chloroform or another organic solvent in 0.001 to 10 wt % in concentration (in accordance with need, also possibly including an acid, alkali, complexing agent, reducing agent, etc.), then reducing the metal etc. may be mentioned.

As the electroless plating solution which is used in the electroless plating, a known self-catalyst type electroless plating solution may be used. It is not particularly limited in the type of metal, the type of reducing agent, the type of complexing agent, the concentration of hydrogen ions, the concentration of dissolved oxygen, etc. which are contained in the plating solution. For example, an electroless copper plating solution which contains ammonium hypophosphite, hypophosphoric acid, ammonium borohydride, hydrazine, formalin, etc. as a reducing agent; an electroless nickel-phosphorus plating solution which contains sodium hypophosphite as a reducing agent; an electroless nickel-boron plating solution which contains dimethylaminoborane as a reducing agent; an electroless palladium plating solution; an electroless palladium-phosphorus plating solution which contains sodium hypophosphite as a reducing agent; an electroless gold plating solution; an electroless silver plating solution; an electroless nickel-cobalt-phosphorus plating solution which contains sodium hypophosphite as a reducing agent, or other electroless plating solution can be used.

After forming the metal thin layer, the substrate surface may be brought into contact with a rustproofing agent to make it rustproof. Further, after forming the metal thin layer, the metal thin layer may be heated to raise the adhesiveness. The heating temperature is usually 50 to 350° C., preferably 80 to 250° C. Note that, at this time, the heating may be performed under pressed conditions. As the pressing method at this time, for example, the method of using a hot press, a pressurizing and heating roll, and other physical pressing means may be mentioned. The pressure which is applied is usually 0.1 to 20 MPa, preferably 0.5 to 10 MPa. If this range, high adhesion can be secured between the metal thin layer and the electrical insulating layer.

The thus formed metal thin layer is formed with a plating-use resist pattern and the plating is further grown over it by electroplating or other wet plating (thickening plating). Next, the resist is removed and the surface is further etched to etch the metal thin layer into the pattern shapes and form the conductor layer. Therefore, the conductor layer which is formed by this method is usually comprised of the patterned metal thin layer and the plating which is grown over that.

For example, using the above obtained multilayer circuit board as the substrate for producing the above-mentioned laminate, the insulating adhesive film (or prepreg) of the present invention is hot pressed on this and cured to form an electrical insulating layer and the above-mentioned method is used to form a conductor layer over this. By repeating these steps, it is possible to further increase the number of layers. Due to this, the desired multilayer circuit board can be obtained.

The thus obtained composite article of the present invention (multilayer circuit board as one example of composite article of the present invention) has an electrical insulating layer which is comprised of the insulating adhesive film (or prepreg) of the present invention. The electrical insulating layer is low in surface roughness, low in linear expansion, excellent in via hole formability, and high in peel strength, so enables good patterning of the conductor layer when forming a conductor layer on that electrical insulating layer, patterning the formed conductor layer, and forming fine wiring. In particular, the composite article of the present invention (and the multilayer circuit board as one example of composite article of the present invention) is excellent in via hole formability, so can form good via holes. Further, despite the low surface roughness, it has high peel strength. Due to this, it is possible to form high density wiring. Furthermore, the linear expansion coefficient is small, so the heat resistance is excellent.

(Substrate for Electronic Material Use)

The substrate for electronic material use of the present invention includes a cured article or composite article of the present invention as a component material. The substrate for electronic material use of the present invention can be suitably used for mobile phones, PHS, laptop PCs, PDAs (personal digital assistants), mobile TV phones, PCs, super computers, servers, routers, liquid crystal projectors, engineering work stations (EWS), pagers, word processors, televisions, viewfinder type or monitor direct viewing type video tape recorders, electronic handheld devices, electronic desktop computers, car navigation systems, POS terminals, devices provided with touch panels, and other various electronic equipment.

EXAMPLES

Below, examples and comparative examples will be given to explain the present invention more specifically. Note that, in the examples, "parts" and "%" are based on weight unless otherwise indicated. The various physical properties were evaluated in accordance with the following methods.

(1) Number Average Molecular Weight (Mn) and Weight Average Molecular Weight (Mw) of Alicyclic Olefin Polymer The alicyclic olefin polymer was measured for number average molecular weight (Mn) and weight average molecular weight (Mw) by gel permeation chromatography (GPC) using tetrahydrofuran as a developing solvent. These were found as values converted to polystyrene.

(2) Hydrogenation Ratio of Alicyclic Olefin Polymer

The ratio of the number of moles of the unsaturated bonds which were hydrogenated with respect to the number of moles of the unsaturated bonds in the polymer before the hydrogenation was found by measurement of the 400 MHz $^1$H-NMR spectrum. This was used as the hydrogenation ratio.

(3) Content of Monomer Units Having Carboxylic Anhydride Groups in Alicyclic Olefin Polymer The ratio of the number of moles of the monomer units which have carboxylic anhydride groups with respect to the number of moles of total monomer units in the polymer was found by measurement of the 400 MHz $^1$H-NMR spectrum. This was used as the content of monomer units having carboxylic anhydride groups of the polymer.

(4) Linear Expansion Coefficient

From a film shaped cured article, a small piece of a width 6 mm and length 15.4 mm was cut. This was measured for linear expansion coefficient at 30° C. to 150° C. under conditions of a distance between supports of 10 mm and rate of temperature rise of 10° C./min by a thermomechanical analyzer (TMA/SDTA840: made by Mettler Toledo).

Good: Value of linear expansion coefficient of less than 30 ppm/° C.

Poor: Value of linear expansion coefficient of 30 ppm/° C. or more (5) Via Hole Formability The electrical insulating layer of the laminate was processed by a $CO_2$ gas laser (made by Hitachi Via Mechanics, Ltd.: LC-2K212/2C) to form holes by a pulse width of 17 μs, frequency of 1000 Hz, and two shots so as to form via holes (top diameter 60 μm) and obtain a laminate which has via holes. Further, the obtained laminate which has via holes was examined for via holes and via hole opening edges by an electron microscope (magnification power: ×1100, same below) and evaluated for state of the holes after formation and roughness of the via hole opening edges. Further, the laminate which has via holes was desmeared (swelled, oxidized, and neutralized/reduced) and the via holes of the desmeared laminate were examined for via holes by an electron microscope and evaluated for state of holes after desmearing. Note that, the state of the holes after formation and the state of the holes after desmearing were evaluated by the following criteria. The results are shown in Table 1.

Good: Ratio of bottom diameter/top diameter of 70% or more

Poor: Ratio of bottom diameter/top diameter of less than 70%

Further, the state of the via holes after desmearing was evaluated by the following criteria. The results are shown in Table 1.

Good: Ratio of top diameter after desmearing/top diameter before desmearing of less than 105%

Poor: Ratio of top diameter after desmearing/top diameter before desmearing of 105% or more Further, the roughness of the viahole opening edges was evaluated by the following criteria. The results are shown in Table 1.

Good: No defects

Poor: Cracks, splatter of resin, roughness, and other defects (6) Adhesion Between Insulating Layer and Metal Layer (Peel Strength)

The peel strength between the insulating layer and the copper plating layer in a multilayer printed circuit board was measured based on JIS C6481-1996.

Good: Peel strength of 5N/cm or more

Poor: Peel strength of less than 5N/cm (7) Surface Roughness (Arithmetic Average Roughness Ra) of Insulating Layer The surface of the electrical insulating layer of a multilayer printed circuit board with interconnect patterns at a part where no conductor patterns are formed was measured by a surface relief measuring apparatus (made by Veeco Instruments, Inc., WYKO NT1100) for surface roughness (arithmetic average roughness Ra) in a measurement range of 91 μm×120 μm.

Good: Surface roughness Ra of less than 0.2 μm

Fair: Surface roughness Ra of 0.2 μm to less than 0.5 μm

Poor: Surface roughness Ra of 0.5 μm or more

Synthesis Example 1

As a first stage of polymerization, 5-ethylidene-bicyclo[2.2.1]hept-2-ene(EdNB) 35 molar parts, 1-hexene 0.9 molar part, anisole 340 molar parts, and 4-acetoxybenzylidene(dichloro)(4,5-dibromo-1,3-dimesityl-4-imidazolin-2-ylidene)(tricyclohexylphosphine)ruthenium (C1063, made by Wako Pure Chemicals Industries, Ltd.) 0.005 molar part were charged into a nitrogen-substituted pressure-resistant glass reactor where they were stirred at 80° C. for 30 minutes for a polymerization reaction to obtain a solution of a norbornene-based ring-opening polymer.

Next, as a second stage of polymerization, to the solution which was obtained in the first stage of polymerization, tetracyclo[9.2.1.0$^{2,10}$.0$^{3,8}$]tetradeca-3,5,7,12-tetraene (MTF) 35 molar parts, bicyclo[2.2.1]hept-2-ene-5,6-dicarboxylic anhydride (NDCA) 30 molar parts, anisole 250 molar parts, and 0.01 molar part of C1063 were added and stirred at 80° C. for 1.5 hours for a polymerization reaction to obtain a solution of a norbornene-based ring-opening polymer. This solution was measured by gas chromatography, whereupon it was confirmed that substantially no monomers remained. The polymerization conversion rate was 99% or more.

Next, to a nitrogen-substituted mixer-equipped autoclave, the obtained solution of the ring-opening polymer was charged, 0.03 molar part of C1063 was added, and the mixture was stirred at 150° C. under a hydrogen pressure of 7 MPa for 5 hours to perform a hydrogenation reaction and obtain a solution of a hydrogenation product of a norbornene-based ring-opening polymer constituted by an alicyclic olefin polymer (P-1). The obtained polymer (P-1) had a weight average molecular weight of 60,000, a number average molecular weight of 30,000, and a molecular weight distribution of 2. Further, the hydrogenation rate was 95%, while the content of the monomer units which have carboxylic acid anhydride groups was 30 mol %. The solution of the polymer (P-1) had a solid content concentration of 22%.

Synthesis Example 2

Tetracyclo[9.2.1.0$^{2,10}$.0$^{3,8}$]tetradeca-3,5,7,12-tetraene (MTF) 70 molar parts, bicyclo[2.2.1]hept-2-ene-5,6-dicarboxylic anhydride (NDCA) 30 molar parts, 1-hexene 0.9 molar part, anisole 590 molar parts, and 0.015 molar part of C1063 were charged into a nitrogen-substituted pressure-resistant glass reactor where they were stirred at 80° C. for 1 hour for a polymerization reaction to obtain a solution of a norbornene-based ring-opening polymer. This solution was measured by gas chromatography, whereupon it was confirmed that there were substantially no monomers remaining. The polymerization conversion rate was 99% or more.

Next, to a nitrogen-substituted mixer-equipped autoclave, the obtained solution of the ring-opening polymer was charged. This was stirred at 150° C. at a hydrogen pressure of 7 MPa for 5 hours for a hydrogenation reaction to obtain a solution of a hydrogenation product of a norbornene-based ring-opening polymer constituted by the alicyclic olefin polymer (P-2). The obtained polymer (P-2) had a weight average molecular weight of 50,000, a number average molecular weight of 26,000, and a molecular weight distribution of 1.9. Further, the hydrogenation rate was 97%, while the content of the monomer units which had carboxylic anhydride groups was 30 mol %. The solution of the polymer (P-2) had a solid content concentration of 22%.

Synthesis Example 3

Tetracyclo[9.2.1.0$^{2,10}$.0$^{3,8}$]tetradeca-3,5,7,12-tetraene (MTF) 70 molar parts, bicyclo[2.2.1]hept-2-ene-5,6-dicarboxylic anhydride (NDCA) 30 molar parts, 1-hexene 6 molar parts, anisole 590 molar parts, and 0.015 molar part of C1063 were charged into a nitrogen-substituted pressure-resistant glass reactor where they were stirred at 80° C. for 1 hour for a polymerization reaction to obtain a solution of a ring-opening polymer. This solution was measured by gas chromatography, whereupon it was confirmed that substantially no monomers remained. The polymerization conversion rate was 99% or more.

Next, to a nitrogen-substituted mixer-equipped autoclave, the obtained solution of the ring-opening polymer was charged. This was stirred at 150° C. under a hydrogen pressure of 7 MPa for 5 hours to perform a hydrogenation reaction. Next, the obtained hydrogenation reaction solution was concentrated to obtain a solution of the alicyclic olefin polymer (P-3). The obtained alicyclic olefin polymer (P-3) had a weight average molecular weight of 10,000, a number average molecular weight of 5,000, and a molecular weight distribution of 2. Further, the hydrogenation rate was 97%, while the content of monomer units which had carboxylic acid anhydride groups was 30 mol %. The solution of the alicyclic olefin polymer (P-3) had a solid content concentration of 55%.

Example 1

Plateable Layer-Use Resin Composition

A solution of the alicyclic olefin polymer (P-1) which was obtained in Synthesis Example 1, 45 parts and 6 parts of silica slurry which was obtained by mixing an inorganic filler (A3) constituted by untreated spherical silica (Admafine (Registered Trademark) SO-C1, made by Admatechs Company Limited, volume average particle diameter 0.25 μm) 98% and the alicyclic olefin polymer (P-2) which was obtained in Synthesis Example 2, 2% in anisole so as to give a solid content of 75% and dispersing them by a high pressure homogenizer were mixed and stirred by a planetary type mixer for 3 minutes.

To this, a curing agent (A2) constituted by a dicyclopentadiene type multifunctional epoxy resin (EPICLON HP-7200L, made by DIC Corporation, epoxy equivalents: 242 to 252) 3.5 parts, a laser processability enhancing agent constituted by 2-[2-hydroxy-3,5-bis(α,α-dimethylbenzyl)phenyl]-2H-benzotriazole 0.1 part, an antiaging agent constituted by tris-(3,5-di-t-butyl-4-hydroxybenzyl)-isocyanulate (IRGANOX (Registered Trademark) 3114, made by BASF) 0.1 part, an antiaging agent constituted by tetrakis (1,2,2,6,6-pentamethyl-4-piperidyl)1,2,3,4-butanetetracarboxylate (Adekastab (Registered Trademark) LA52, made by ADEKA CORPORATION) 0.05 part, and anisole 75.2 parts were mixed and stirred by a planetary type mixer for 3 minutes.

Furthermore, to this, a solution in which a curing accelerator constituted by 1-benzyl-2-phenylimidazole was dissolved 50% in anisole 0.1 part was mixed. The mixture was stirred by a planetary type mixer for 5 minutes to obtain a varnish of a plateable layer-use resin composition.

(Adhesive Layer-Use Resin Composition)

A solution of the alicyclic olefin polymer (P-2) which was obtained in Synthesis Example 2, 9.1 parts and 84.6 parts of silica slurry which was obtained by mixing an inorganic filler (B3) constituted by surface-treated spherical silica (Admafine (Registered Trademark) SC-2500-SXJ, made by Admatechs Company Limited, aminosilane type silane coupling agent-treated product, volume average particle diameter 0.5 μm) 98.5% and the alicyclic olefin polymer (P-3) which was obtained in Synthesis Example 3, 1.5% in anisole so as to give a solid content of 78% and treating them by a high pressure homogenizer were mixed and stirred by a planetary type mixer for 3 minutes.

To this, a curing agent (B2) constituted by bisphenol A type epoxy resin (Epicoat (Registered Trademark) 828EL, made by Mitsubishi Chemical Corporation, epoxy equivalents: 184 to 194) 3 parts, multifunctional epoxy resin (1032H60, made by Mitsubishi Chemical Corporation, epoxy equivalents: 163 to 175) 3 parts, dicyclopentadiene type multifunctional epoxy resin (EPICLON HP-7200L) 11 parts, an antiaging agent constituted by tris-(3,5-di-t-butyl-4-hydroxybenzyl)-isocyanulate 0.1 part, dicyclopentadiene type novolac resin (GDP-6140, made by Gun Ei Chemical Industry Co., Ltd.) 15 parts, and anisole 2.4 pars were mixed and stirred by a planetary type mixer for 3 minutes. Furthermore, to this, a solution in which a curing accelerator constituted by 1-benzyl-2-phenylimidazole was dissolved 50% in anisole 0.3 part was mixed. The mixture was stirred by a planetary type mixer for 5 minutes to obtain a varnish of an adhesive layer-use resin composition.

(Preparation of Adhesive Film)

The varnish of the plateable layer-use resin composition which was obtained above was coated on a thickness 100 μm polyethylene terephthalate film (support) by using a wire bar, then was dried in a nitrogen atmosphere at 85° C. for 5 minutes to obtain a film with a support on which a thickness 3 μm plateable layer comprised of an uncured plateable layer-use resin composition was formed.

Next, the surface of the film with the support on which the plateable layer comprised of the plateable layer-use resin composition was formed was coated with the varnish of the adhesive layer-use resin composition which was obtained above by using a doctor blade (made by Tester Sangyo Co., Ltd) and an auto film applicator (made by Tester Sangyo Co., Ltd), then was dried in a nitrogen atmosphere at 80° C. for 10 minutes to obtain an adhesive film with the support on which a total thickness 40 μm plateable layer and adhesive layer were formed. The adhesive film with the support was formed by the support, the plateable layer comprised of the plateable layer-use resin composition, and the adhesive layer comprised of the adhesive layer-use resin composition in that order. The ratios of content of the main ingredients among the ingredients which form the plateable layer and adhesive layer of the obtained adhesive film are shown in Table 1.

(Preparation of Film-Shaped Cured Article)

Next, thickness 10 μm copper foil was placed on a copper-clad multilayer substrate. From above, the thus obtained adhesive film with the support was set, in the state with the support attached, so that the adhesive layer became the inside. A vacuum laminator which was provided with heat resistant rubber press plates at the top and bottom was used to reduce the pressure to 200 Pa and perform a hot press bonding to obtain a laminate at a temperature of 110° C. and a pressure of 0.1 MPa for 60 seconds, then heat and cure the laminate at 180° C. for 120 minutes in the air. After curing, the cured resin with the copper foil was cut out. The copper foil was dissolved in a 1 mol/liter ammonium persulfate aqueous solution and dried to obtain a film-shaped cured article. Further, the obtained film-shaped cured article was measured for linear expansion coefficient in accordance with the above method. The results are shown in Table 1.

(Preparation of Laminate)

Next, separate from the above, a varnish which contained a glass filler and halogen-free epoxy resin was made to impregnate the glass fibers to obtain a core material. On the two surfaces, thickness 35 µm copper films were bonded to obtain a thickness 0.8 mm×vertical 150 mm×horizontal 150 mm two-sided copper-clad multilayer substrate. The copper surfaces of this were microetched by contact with an organic acid to obtain a two-sided copper-clad multilayer substrate (insider layer substrate).

At the two sides of this inside layer substrate, pieces of the above obtained adhesive film with the support which were cut into 150 mm squares were superposed so that the adhesive layer-use resin composition sides were at the insides, then the assembly was pressed by a primary pressing operation. The primary pressing operation was hot pressing by a vacuum laminator which was provided with heat-resistant rubber press plates at the top and bottom under a reduced pressure of 200 Pa at a temperature of 110° C. and a pressure of 0.1 MPa for 90 seconds. Furthermore, a hydraulic press apparatus which was provided with metal press plates at the top and bottom was used to hot press the assembly at a press bonding temperature of 110° C. and 1 MPa for 90 seconds. Next, the support was peeled off to thereby obtain a laminate of a resin layer which was comprised of the plateable layer-use resin composition and the adhesive layer-use resin composition and the inside layer substrate. Furthermore, the laminate was allowed to stand in an air atmosphere at 180° C. for 60 minutes to make the resin layer cure and form an electrical insulating layer on the inside layer substrate. Further, the obtained laminate was used to evaluate the via hole formability in accordance with the above method. The results are shown in Table 1.

(Swelling Treatment Step)

The obtained laminate was dipped while shaking in a 60° C. aqueous solution which was prepared to contain a swelling solution ("Swelling Dip Securiganth P", made by Atotech, "Securiganth" is a registered trademark) 500 ml/liter and sodium hydroxide 3 g/liter for 15 minutes, then was rinsed.

(Oxidizing Treatment Step)

Next, the laminate was dipped while shaking in an 80° C. aqueous solution which was prepared to contain an aqueous solution of permanganate ("Concentrate Compact CP", made by Atotech) 500 ml/liter and a concentration of sodium hydroxide of 40 g/liter for 20 minutes, then was rinsed.

(Neutralizing/Reduction Treatment Step)

Next, the laminate was dipped in a 40° C. aqueous solution which was prepared to contain an aqueous solution of hydroxylamine sulfate ("Reduction Securiganth P 500", made by Atotech, "Securiganth" is a registered trademark) 100 ml/liter and sulfuric acid 35 ml/liter for 5 minutes to neutralize and reduce it, then was rinsed.

(Cleaner/Conditioner Step)

Next, the laminate was dipped in a 50° C. aqueous solution which was prepared to contain a cleaner/conditioner aqueous solution ("Alcup MCC-6-A", made by Uyemura & Co., Ltd. "Alcup" is a registered trademark) of a concentration of 50 ml/liter for 5 minutes to treat it with the cleaner and conditioner. Next, the laminate was dipped in 40° C. rinsing water for 1 minute, then was rinsed.

(Soft Etching Step)

Next, the laminate was dipped in an aqueous solution which was prepared to contain a sulfuric acid concentration of 100 g/liter and sodium persulfate of 100 g/liter for 2 minutes to be soft etched, then was rinsed.

(Pickling Step)

Next, the laminate was dipped in an aqueous solution which was prepared to contain a sulfuric acid concentration of 100 g/liter for 1 minute to be pickled, then was rinsed.

(Catalyst Imparting Step)

Next, the laminate was dipped in a 60° C. Pd salt-containing plating catalyst aqueous solution which was prepared to contain Alcup Activator MAT-1-A (product name, made by Uyemura & Co., Ltd. "Alcup" is a registered trademark) 200 ml/liter, Alcup Activator MAT-1-B (product name, made by Uyemura & Co., Ltd. "Alcup" is a registered trademark) 30 ml/liter, and sodium hydroxide 0.35 g/liter for 5 minutes, then was rinsed.

(Activation Step)

Next, the laminate was dipped in an aqueous solution which was prepared to contain Alcup Reducer MAB-4-A (product name, made by Uyemura & Co., "Alcup" is a registered trademark) 20 ml/liter and Alcup Reducer MAB-4-B (product name, made by Uyemura & Co., Ltd. "Alcup" is a registered trademark) 200 ml/liter at 35° C. for 3 minutes to reduce the plating catalyst, then was rinsed.

(Accelerator Treatment Step)

Next, the laminate was dipped in an aqueous solution which was prepared to contain Alcup Accelerator MEL-3-A (product name, made by Uyemura & Co., Ltd. "Alcup" is a registered trademark) 50 ml/liter at 25° C. for 1 minute.

(Electroless Plating Step)

The thus obtained laminate was dipped in an electroless copper plating solution which was prepared to contain Thru-Cup PEA-6-A (product name, made by Uyemura & Co., Ltd. "Thru-Cup" is a registered trademark) 100 ml/liter, Thru-Cup PEA-6-B-2X (product name, made by Uyemura & Co. Ltd.) 50 ml/liter, Thru-Cup PEA-6-C (product name, made by Uyemura & Co. Ltd.) 14 ml/liter, Thru-Cup PEA-6-D (product name, made by Uyemura & Co. Ltd.) 15 ml/liter, Thru-Cup PEA-6-E(product name, made by Uyemura & Co. Ltd.) 50 ml/liter, and 37% formalin aqueous solution 5 ml/liter, while blowing in air, at a temperature of 36° C. for 20 minutes for electroless copper plating so as to form an electroless plating film on the laminate surface (surface of plateable layer comprised of plateable layer-use resin composition). Next, the laminate was annealed in an air atmosphere at 150° C. for 30 minutes.

The annealed laminate was electroplated with copper to form a thickness 30 µm electroplated copper layer. Next, the laminate was heat treated at 180° C. for 60 minutes to thereby obtain a two-sided two-layer multilayer printed circuit board A comprised of a laminate on which circuits are formed by conductor layers which are comprised of the metal thin film layers and electroplated copper layers. Further, the obtained circuit board was measured for peel strength in accordance with the above method. The results are shown in Table 1.

Further, the annealed laminate was hot press bonded with dry film of a commercially available photosensitive resist. Next, a mask of evaluation-use patterns was placed closely against this dry film and this was exposed to obtain resist patterns. Next, the laminate was dipped in an aqueous solution of sulfuric acid 50 ml/liter at 25° C. for 1 minute to remove the rustproofing agent, and the parts where the resist was not formed were electroplated with copper to form a thickness 18 μm electroplated copper layer. After that, the resist patterns on the laminate were removed using a peeling solution and the laminate was etched by a mixed solution of ferric chloride and hydrochloric acid. Next, the laminate was heat treated at 180° C. for 60 minutes to thereby obtain a two-sided two-layer interconnect-pattern multilayer printed circuit board B comprised of a laminate on which circuits are formed by conductor layers which are comprised of the metal thin film layers and electroplated copper layers. The obtained interconnect-pattern multilayer printed circuit board B was measured by the above method for surface average roughness Ra of the electrical insulating layer at the parts where the conductor circuits are not formed. The results are shown in Table 1.

Example 2

When obtaining the plateable layer-use resin composition, except for changing the amount of the solution of the alicyclic olefin polymer (P-1) which was obtained at Synthesis Example 1 to 45.2 parts, changing the amount of the silica slurry, which was obtained by mixing an inorganic filler (A3) constituted by untreated spherical silica (Admafine SO-C1, made by Admatechs Company Limited, volume average particle diameter 0.25 μm) in 98% and the alicyclic olefin polymer (P-2) which was obtained in Synthesis Example 2 in 2% in anisole so as to give a solid content of 75% and treating them by a high pressure homogenizer for dispersion, to 3.3 parts, and changing the amount of the anisole to 63.7 parts, the same procedure was followed as in Example 1 to obtain a varnish of the plateable layer-use resin composition. Except for using the obtained varnish of the plateable layer-use resin composition, the same procedure was followed as in Example 1 to obtain an adhesive film, laminate, and multilayer printed circuit boards A and B, and those were then similarly evaluated. The results of evaluation and the ratios of content of the main ingredients among the ingredients which form the plateable layer and adhesive layer of the adhesive film are shown in Table 1.

Example 3

When obtaining the plateable layer-use resin composition, except for changing the amount of the solution of the alicyclic olefin polymer (P-1) which was obtained at Synthesis Example 1 to 45.4 parts, changing the concentration of the silica slurry, which was obtained by mixing an inorganic filler (A3) constituted by untreated spherical silica (Admafine SO-C1, made by Admatechs Company Limited, volume average particle diameter 0.25 μm) in 98% and the alicyclic type olefin polymer (P-2) which was obtained in Synthesis Example 2 in 2% in anisole so as to give a solid content of 78% and treating them by a high pressure homogenizer for 15 minutes for dispersion, in 0.9 part, and changing the amount of the anisole to 53.3 parts, the same procedure was followed as in Example 1 to obtain a varnish of the plateable layer-use resin composition. Except for using the obtained varnish of the plateable layer-use resin composition, the same procedure was followed as in Example 1 to obtain an adhesive film, laminate, and multilayer printed circuit boards A and B, and those were then similarly evaluated. The results of evaluation and the ratios of content of the main ingredients among the ingredients which form the plateable layer and adhesive layer of the adhesive film are shown in Table 1.

Example 4

When obtaining the adhesive layer-use resin composition, except for changing the amount of solution of the alicyclic olefin polymer (P-2) from 9.1 parts to 2.1 parts, instead of using the silica slurry, which was obtained by mixing an inorganic filler (B3) constituted by surface treated spherical silica (Admafine SC-2500-SXJ, made by Admatechs Company Limited, amino silane type silane coupling agent treated product, volume average particle diameter 0.5 μm), the alicyclic olefin polymer (P-3) which was obtained in Synthesis Example 3, and anisole, adding surface treated spherical silica (Admafine SC-2500-SXJ, made by Admatechs, amino silane type silane coupling agent treated product, volume average particle diameter 0.5 μm) 65 parts, the dicyclopentadiene type novolac resin (GDP-6140, made by Gun Ei Chemical Industry Co., Ltd.), also changing the amount thereof from 15 parts to 16 parts, and adding the anisole, also changing the amount thereof to 28 parts, the same procedure was followed as in Example 1 to obtain a varnish of the adhesive layer-use resin composition. Except for using the obtained adhesive layer-use resin composition, the same procedure was followed as in Example 1 to obtain an adhesive film, laminate, and multilayer printed circuit boards A and B, and those were then similarly evaluated. The results of evaluation and the ratios of content of the main ingredients among the ingredients which form the plateable layer and adhesive layer of the adhesive film are shown in Table 1.

Example 5

When obtaining the adhesive layer-use resin composition, except for changing the amount of the solution of the alicyclic olefin polymer (P-2) from 9.1 parts to 24.6 parts, changing the amount of the silica slurry, which was obtained by mixing an inorganic filler (B3) constituted by surface treated spherical silica (Admafine SC-2500-SXJ, made by Admatechs Company Limited, amino silane type silane coupling agent treated product, volume average particle diameter 0.5 μm), the alicyclic olefin polymer (P-3) which was obtained in Synthesis Example 3, and anisole, from 84.6 parts to 91.2 parts, and changing the amount of the dicyclopentadiene type novolac resin (GDP-6140, made by Gunei Chemical Industry) from 15 parts to 14 parts, the same procedure was followed as in Example 1 to obtain a varnish of an adhesive layer-use resin composition. Except for using the obtained adhesive layer-use resin composition, the same procedure was followed as in Example 1 to obtain an adhesive film, laminate, and multilayer printed circuit boards A and B, and those were then similarly evaluated. The results of evaluation and the ratios of content of the main ingredients among the ingredients which form the plateable layer and adhesive layer of the adhesive film are shown in Table 1.

Comparative Example 1

When obtaining the adhesive layer-use resin composition, except for changing the solution of the alicyclic olefin polymer (P-2) which was obtained in Synthesis Example 2 to a solution of the alicyclic olefin polymer (P-3) which was obtained in Synthesis Example 3 in 1.4 parts, changing the silica slurry, which was obtained by mixing an inorganic filler (B3) constituted by surface treated spherical silica (Admafine SC-2500-SXJ, made by Admatechs Company Limited, amino silane type silane coupling agent treated product, volume average particle diameter 0.5 μm) 98.5% and the alicyclic olefin polymer (P-3) which was obtained in Synthesis Example 3, 1.5% in anisole so as to give a solid content of 78% and treating by a high pressure homogenizer for dispersion, in 19.2 parts, and changing the amount of the anisole to 2.5 parts, the same procedure was followed as in Example 1 to obtain a varnish of the adhesive layer-use resin composition. Except for using the obtained varnish of the adhesive layer-use resin composition, the same procedure was followed as in Example 2 to obtain an adhesive film, laminate, and multilayer printed circuit boards A and B, and those were then similarly evaluated. The results of evaluation and the ratios of content of the main ingredients among the ingredients which form the plateable layer and adhesive layer of the adhesive film are shown in Table 1.

Comparative Example 2

When obtaining the plateable layer-use resin composition, except for changing the amount of the solution of the alicyclic olefin polymer (P-1) which was obtained in Synthesis Example 1 to 44.5 parts, changing the concentration of the silica slurry, which was obtained by mixing an inorganic filler (A3) constituted by untreated spherical silica (Admafine SO-C1, made by Admatechs Company Limited, volume average particle diameter 0.25 μm) in 98% and the alicyclic olefin polymer (P-2) which was obtained in Synthesis Example 2 in 2% in anisole so as to give a solid content of 78% and treating them by a high pressure homogenizer for 15 minutes for dispersion, in 13.3 parts, and the amount of the anisole to 106.8 parts, the same procedure was followed as in Example 1 to obtain a varnish of the plateable layer-use resin composition. Except for using the obtained varnish of the plateable layer-use resin composition, the same procedure was followed as in Example 1 to obtain an adhesive film, laminate, and multilayer printed circuit boards A and B, and those were then similarly evaluated. The results of evaluation and the ratios of content of the main ingredients among the ingredients which form the plateable layer and adhesive layer of the adhesive film are shown in Table 1.

Comparative Example 3

When obtaining the adhesive layer-use resin composition, a solution of the alicyclic olefin polymer (P-2) which was obtained in Synthesis Example 2, 40.9 parts, a solution of the alicyclic olefin polymer (P-3) which was obtained in Synthesis Example 3, 1.4 parts, and a silica slurry which was obtained by adding an inorganic filler (B3) constituted by surface treated spherical silica (Admafine SC-2500-SXJ, made by Admatechs Company Limited, amino silane type silane coupling agent treated product, volume average particle diameter 0.5 μm) 98.5% and the alicyclic olefin polymer (P-3) which was obtained in Synthesis Example 3, 1.5% to anisole to give a solid content of 78% and treating them by a high pressure homogenizer for 15 minutes for dispersion, 20.8 parts, were mixed and stirred by a planetary type mixer for 3 minutes.

To this, a curing agent (B2) constituted by bisphenol A type epoxy resin (Epicoat (registered trademark) 828EL, made by Mitsubishi Chemical Corporation, epoxy equivalents: 184 to 194) 0.8 part, a multifunctional epoxy resin (1032H60, made by Mitsubishi Chemical Corporation, epoxy equivalents: 163 to 175) 2 parts, and an antiaging agent constituted by tris(3,5-di-t-butyl-4-hydroxybenzyl)-isocyanulate 0.1 part were mixed and stirred by a planetary type mixer for 3 minutes. Furthermore, to this, a solution of a curing accelerator constituted by 1-benzyl-2-phenylimidazole dissolved in anisole to 50%, 0.3 part was mixed and stirred by a planetary type mixer for 5 minutes to obtain a varnish of the adhesive layer-use resin composition. Except for using the obtained varnish of the adhesive layer-use resin composition, the same procedure was followed as in Example 2 to obtain an adhesive film, laminate, and multilayer printed circuit boards A and B, and those were then similarly evaluated. The results of evaluation and the ratios of content of the main ingredients among the ingredients which form the plateable layer and adhesive layer of the adhesive film are shown in Table 1.

Comparative Example 4

When obtaining the plateable layer-use resin composition, except for using the solution of the alicyclic olefin polymer (P-1) and the silica slurry comprised of an inorganic filler (A3) constituted by untreated spherical silica (Admafine SO-C1, made by Admatechs Company Limited, volume average particle diameter 0.25 μm), the alicyclic olefin polymer (P-2) which was obtained in Synthesis Example 2, and anisole, using 3- or 4-methyl-hexahydro anhydrous phthalic acid (HN-5500, made by Hitachi Chemical) 2.2 parts, untreated spherical silica (Admafine SO-C1) 1.5 parts and anisole 6.7 parts, the same procedure was followed as in Example 1 to obtain a varnish of the plateable layer-use resin composition. Except for using the obtained varnish of the plateable layer-use resin composition, the same procedure was followed as in Example 1 to obtain an adhesive film, laminate, and multilayer printed circuit boards A and B, and those were then similarly evaluated. The results of evaluation and the ratios of content of the main ingredients among the ingredients which form the plateable layer and adhesive layer of the adhesive film are shown in Table 1.

TABLE 1

|  |  | Examples | | | | |
| --- | --- | --- | --- | --- | --- | --- |
|  |  | 1 | 2 | 3 | 4 | 5 |
| Ratio of content of plateable layer | | | | | | |
| Alicyclic olefin polymer (P-1) | (%) | 54.4 | 61.2 | 68.9 | 61.2 | 61.2 |
| Alicyclic olefin polymer (P-2) | (%) | 0.5 | 0.3 | 0.1 | 0.3 | 0.3 |
| Multifunctional epoxy resin | (%) | 19.2 | 21.5 | 24.2 | 21.5 | 21.5 |
| Untreated silica (average particle diameter: 0.25 μm) | (%) | 24 | 15 | 5 | 15 | 15 |
| Ratio of content of adhesive layer | | | | | | |
| Alicyclic olefin polymer (P-2) | (%) | 2.0 | 2.0 | 2.0 | 0.5 | 5.0 |
| Alicyclic olefin polymer (P-3) | (%) | 1.0 | 1.0 | 1.0 | 0.0 | 1.0 |

TABLE 1-continued

|  |  |  |  |  |  |  |
|---|---|---|---|---|---|---|
| Multifunctional epoxy resin | (%) | 17 | 17 | 17 | 18 | 16 |
| Coupling agent-treated silica (average particle diameter: 0.5 μm) | (%) | 65 | 65 | 65 | 65 | 65 |
| Ratio of alicyclic olefin polymer in organic ingredients in adhesive layer-use resin composition*[1] | (%) | 8.6 | 8.6 | 8.6 | 1.4 | 17.1 |

Results of evaluation

|  |  |  |  |  |  |
|---|---|---|---|---|---|
| Linear expansion coefficient | Good | Good | Good | Good | Good |
| Via hole formability (state of hole after formation) | Good | Good | Good | Good | Good |
| Via hole formability (state of hole after desmearing) | Good | Good | Good | Good | Good |
| Via hole formability (roughness of open edges of via hole) | Good | Good | Good | Good | Good |
| Peel strength | Good | Good | Good | Good | Good |
| Surface roughness | Good | Good | Good | Good | Good |

|  |  | Comparative Examples | | | |
|---|---|---|---|---|---|
|  |  | 1 | 2 | 3 | 4 |
| Ratio of content of plateable layer | | | | | |
| Alicyclic olefin polymer (P-1) | (%) | 61.2 | 41.5 | 61.2 | — |
| Alicyclic olefin polymer (P-2) | (%) | 0.3 | 0.8 | 0.3 | — |
| Multifunctional epoxy resin | (%) | 21.5 | 14.8 | 21.5 | 49.3 |
| Untreated silica (average particle diameter: 0.25 μm) | (%) | 15 | 42 | 15 | 15 |
| Ratio of content of adhesive layer | | | | | |
| Alicyclic olefin polymer (P-2) | (%) | 4.0 | 2.0 | 31.0 | 2.0 |
| Alicyclic olefin polymer (P-3) | (%) | 2.0 | 1.0 | 3.4 | 1.2 |
| Multifunctional epoxy resin | (%) | 34 | 17 | 10 | 17 |
| Coupling agent-treated silica (average particle diameter: 0.5 μm) | (%) | 30 | 65 | 55 | 65 |
| Ratio of alicyclic olefin polymer in organic ingredients in adhesive layer-use resin composition*[1] | (%) | 8.6 | 8.6 | 76.4 | 9.1 |
| Results of evaluation | | | | | |
| Linear expansion coefficient | | Poor | Good | Poor | Good |
| Via hole formability (state of hole after formation) | | Poor | Good | Poor | Good |
| Via hole formability (state of hole after desmearing) | | Poor | Good | Poor | Poor |
| Via hole formability (roughness of open edges of via hole) | | Good | Poor | Good | Poor |
| Peel strength | | Good | Poor | Good | Poor |
| Surface roughness | | Good | Fair | Good | Poor |

*[1]"Organic ingredients in adhesive layer-use resin composition" mean ingredients after removal of inorganic filler (coupling agent treated silica) from solid ingredients in adhesive layer-use resin composition.

In Table 1, the ratios of content of the ingredients are ratios to the solid content as a whole which forms the plateable layer or to the solid content as a whole which forms the adhesive layer.

As shown in Table 1, by using an insulating adhesive film which has a layer comprised of a plateable layer-use resin composition which contains 50 to 90 wt % of a polar group-containing alicyclic olefin polymer and a curing agent as the plateable layer and has a layer comprised of an adhesive layer-use resin composition which contains 1 to 30 wt % of a polar group-containing alicyclic olefin polymer, a curing agent, and 50 to 90 wt % of an inorganic filler as the adhesive layer, it was possible to form an electrical insulating layer which was low in linear expansion, low in surface roughness, and excellent in via hole formability and peel strength (Examples 1 to 3).

On the other hand, when the ratio of content of the inorganic filler in the adhesive layer-use resin composition which forms the adhesive layer was less than 50 wt %, the via hole formability, in particular, the state of the hole after formation and the state of the hole after desmearing, was poor (Comparative Example 1).

When the ratio of content of the polar group-containing alicyclic olefin polymer in the plateable layer-use resin composition which forms the plateable layer was less than 50 wt %, the via hole formability, in particular, the roughness of the viahole opening edges was poor, the peel strength fell, the plating adhesion was poor, and, furthermore, the surface roughness was also poor (Comparative Example 2).

Further, when the ratio of content of the polar group-containing alicyclic olefin polymer in the adhesive layer-use resin composition which forms the adhesive layer was over 30 wt %, the via hole formability, in particular, the state of the hole after formation, was poor, the linear expansion coefficient was high, and the heat resistance was poor (Comparative Example 3).

Furthermore, when using a resin ingredient of the plateable layer-use resin composition which forms the plateable layer constituted by a phenol resin, the via hole formability, in particular, the state of the hole after desmearing, deteriorated, roughness was caused at the viahole opening edges, and, furthermore, the peel strength and surface roughness were both inferior (Comparative Example 4).

The invention claimed is:

1. An insulating adhesive film having
   a plateable layer which is comprised of a plateable layer-use resin composition which contains a polar group-containing alicyclic olefin polymer (A1) and a curing agent (A2) and
   an adhesive layer which is comprised of an adhesive layer-use resin composition which contains a polar group-containing alicyclic olefin polymer (B1), a curing agent (B2), and an inorganic filler (B3), wherein
   a ratio of content of said polar group-containing alicyclic olefin polymer (A1) to the solid content as a whole which is contained in said plateable layer is 50 to 90 wt %, and
   a ratio of content of said polar group-containing alicyclic olefin polymer (B1) to the solid content as a whole which is contained in said adhesive layer is 1 to 30 wt % and a ratio of content of said inorganic filler (B3) is 50 to 90 wt %.

2. An insulating adhesive film having
a plateable layer which is comprised of a plateable layer-use resin composition which contains a polar group-containing alicyclic olefin polymer (A1) and a curing agent (A2) and
an adhesive layer which is comprised of an adhesive layer-use resin composition which contains a polar group-containing alicyclic olefin polymer (B1), a curing agent (B2), and an inorganic filler (B3), wherein
a ratio of content of said polar group-containing alicyclic olefin polymer (A1) to the solid content as a whole which is contained in said plateable layer is 50 to 90 wt %, and
a ratio of content of said polar group-containing alicyclic olefin polymer (B1) to the solid content as a whole with the exception of the inorganic filler (B3) which is contained in said adhesive layer is 20 wt % or less and a ratio of content of said inorganic filler (B3) to the solid content as a whole which is contained in said adhesive layer is 50 to 90 wt %.

3. The insulating adhesive film as set forth in claim 1, wherein
said plateable layer-use resin composition which forms said plateable layer further contains an inorganic filler (A3), and
a ratio of content of said inorganic filler (A3) to the solid content as a whole which is contained in said plateable layer is 1 to 40 wt %.

4. The insulating adhesive film as set forth in claim 2, wherein
said plateable layer-use resin composition which forms said plateable layer further contains an inorganic filler (A3), and
a ratio of content of said inorganic filler (A3) to the solid content as a whole which is contained in said plateable layer is 1 to 40 wt %.

5. The insulating adhesive film as set forth in claim 1, wherein said inorganic filler (B3) is spherical silica having an average particle diameter from 0.2 to 3 μm.

6. The insulating adhesive film as set forth in claim 2, wherein said inorganic filler (B3) is spherical silica having an average particle diameter from 0.2 to 3 μm.

7. The insulating adhesive film as set forth in claim 1, wherein said inorganic filler (B3) is surface treated spherical silica which is treated on its surface.

8. The insulating adhesive film as set forth in claim 2, wherein said inorganic filler (B3) is surface treated spherical silica which is treated on its surface.

9. The insulating adhesive film as set forth in claim 4, wherein said inorganic filler (A3) is spherical silica having an average particle diameter from 0.1 to 0.5 μm.

10. The insulating adhesive film as set forth in claim 4, wherein said inorganic filler (A3) is untreated spherical silica which is not treated on its surface.

11. A prepreg which is comprised of the insulating adhesive film as set forth in claim 1 and a fiber base material.

12. A prepreg which is comprised of the insulating adhesive film as set forth in claim 2 and a fiber base material.

13. A laminate obtained by laminating the insulating adhesive film as set forth in claim 1 on a base material.

14. A laminate obtained by laminating the insulating adhesive film as set forth in claim 2 on a base material.

15. A cured article obtained by curing the insulating adhesive film as set forth in claim 1.

16. A cured article obtained by curing the insulating adhesive film as set forth in claim 2.

17. A composite article obtained by forming a conductive layer on the surface of the cured article as set forth in claim 15 by electroless plating.

18. A composite article obtained by forming a conductive layer on the surface of the cured article as set forth in claim 16 by electroless plating.

19. A substrate for electronic material-use which is comprised of the cured article as set forth in claim 15 as a component material.

20. A substrate for electronic material-use which is comprised of the cured article as set forth in claim 16 as a component material.

* * * * *